US012255100B2

(12) United States Patent
More et al.

(10) Patent No.: US 12,255,100 B2
(45) Date of Patent: *Mar. 18, 2025

(54) INNER FILLER LAYER FOR MULTI-PATTERNED METAL GATE FOR NANOSTRUCTURE TRANSISTOR

(71) Applicant: Taiwan Semiconductor Manufacturing Co., Ltd., Hsinchu (TW)

(72) Inventors: Shahaji B. More, Hsinchu (TW); Chandrashekhar Prakash Savant, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/361,717

(22) Filed: Jul. 28, 2023

(65) Prior Publication Data
US 2023/0377977 A1  Nov. 23, 2023

Related U.S. Application Data

(63) Continuation of application No. 17/316,486, filed on May 10, 2021, now Pat. No. 11,749,566.
(Continued)

(51) Int. Cl.
*H01L 21/8234* (2006.01)
*H01L 21/02* (2006.01)
(Continued)

(52) U.S. Cl.
CPC .. *H01L 21/823412* (2013.01); *H01L 21/0259* (2013.01); *H01L 21/02603* (2013.01);
(Continued)

(58) Field of Classification Search
CPC ........... H01L 21/0259; H01L 21/02603; H01L 21/31111; H01L 21/823412; H01L 21/823431; H01L 21/823468; H01L 27/088; H01L 27/0886; H01L 29/0665; H01L 29/0673; H01L 29/42392;
(Continued)

(56) References Cited

U.S. PATENT DOCUMENTS 9,236,267 B2  1/2016  De et al.
9,502,265 B1  11/2016  Jiang et al.
(Continued)

FOREIGN PATENT DOCUMENTS

TW  202029360 A  8/2020
TW  202040820 A  11/2020

*Primary Examiner* — Cheung Lee
(74) *Attorney, Agent, or Firm* — Seed IP Law Group LLP

(57) ABSTRACT

An integrated circuit includes a first nanostructure transistor and a second nanostructure transistor. When forming the integrated circuit, an inter-sheet fill layer is deposited between semiconductor nanostructures of the second nanostructure transistor. A first gate metal layer is deposited between semiconductor nanostructures of the first nanostructure transistor while the inter-sheet filler layer is between the semiconductor nanostructures of the second nanostructure transistor. The inter-sheet filler layer is utilized to ensure that the first gate metal is not deposited between the semiconductor nanostructures of the second nanostructure transistor.

20 Claims, 14 Drawing Sheets

Related U.S. Application Data

(60) Provisional application No. 63/138,270, filed on Jan. 15, 2021.

(51) Int. Cl.

| | | |
|---|---|---|
| *H01L 21/311* | (2006.01) | |
| *H01L 27/088* | (2006.01) | |
| *H01L 29/06* | (2006.01) | |
| *H01L 29/423* | (2006.01) | |
| *H01L 29/66* | (2006.01) | |
| *H01L 29/78* | (2006.01) | |
| *H01L 29/786* | (2006.01) | |

(52) U.S. Cl.
CPC ............... *H01L 21/31111* (2013.01); *H01L 21/823431* (2013.01); *H01L 21/823468* (2013.01); *H01L 27/088* (2013.01); *H01L 27/0886* (2013.01); *H01L 29/0665* (2013.01); *H01L 29/0673* (2013.01); *H01L 29/42392* (2013.01); *H01L 29/66545* (2013.01); *H01L 29/66553* (2013.01); *H01L 29/66742* (2013.01); *H01L 29/785* (2013.01); *H01L 29/78696* (2013.01)

(58) Field of Classification Search
CPC ......... H01L 29/66439; H01L 29/66545; H01L 29/66553; H01L 29/66742; H01L 29/775; H01L 29/785; H01L 29/78696; B82Y 10/00

See application file for complete search history.

(56) References Cited

U.S. PATENT DOCUMENTS

| | | |
|---|---|---|
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,786,774 B2 | 10/2017 | Colinge et al. |
| 9,853,101 B2 | 12/2017 | Peng et al. |
| 9,881,993 B2 | 1/2018 | Ching et al. |
| 10,103,065 B1 | 10/2018 | Mochizuki et al. |
| 10,978,357 B2 | 4/2021 | Chang et al. |
| 2017/0104061 A1 | 4/2017 | Peng |
| 2018/0175036 A1 | 6/2018 | Ching et al. |
| 2020/0035786 A1 | 1/2020 | Xie et al. |
| 2020/0105902 A1 | 4/2020 | Ching et al. |
| 2020/0152738 A1 | 5/2020 | Kim et al. |

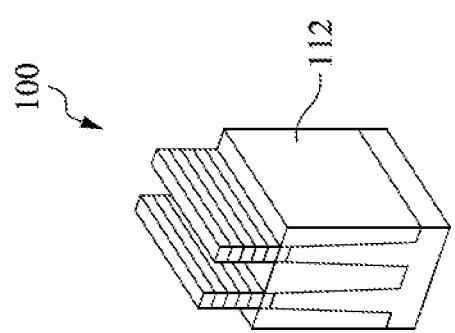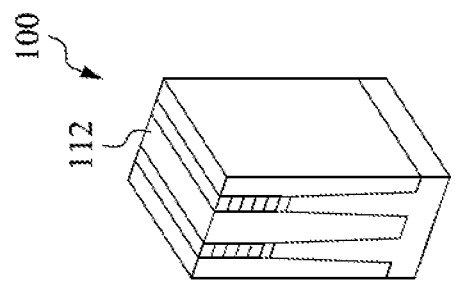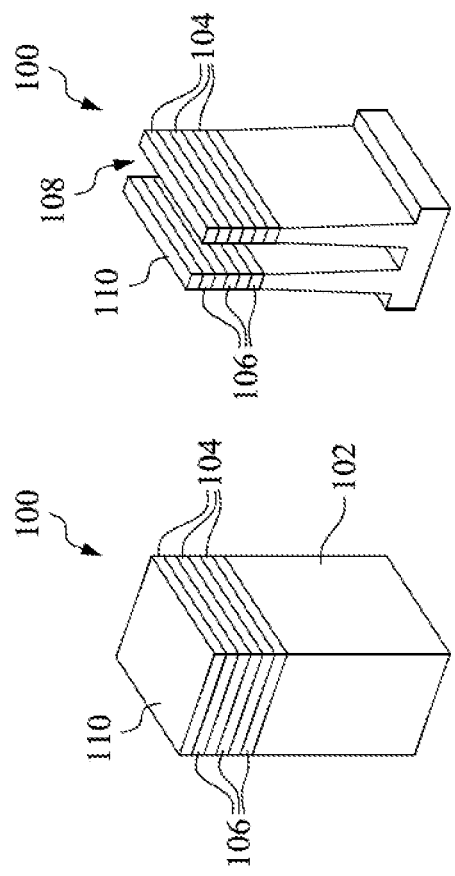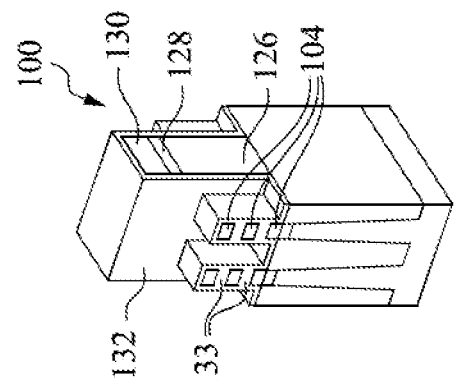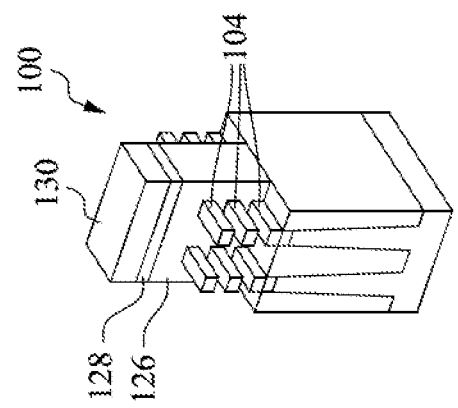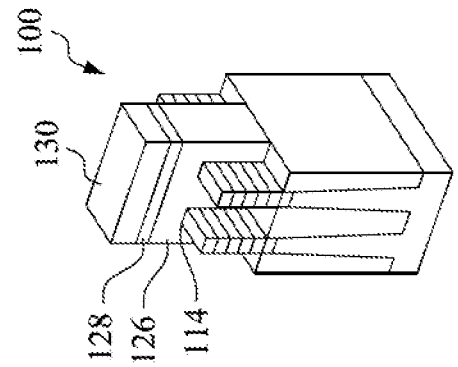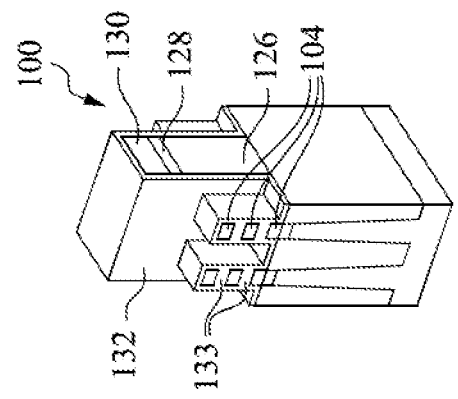

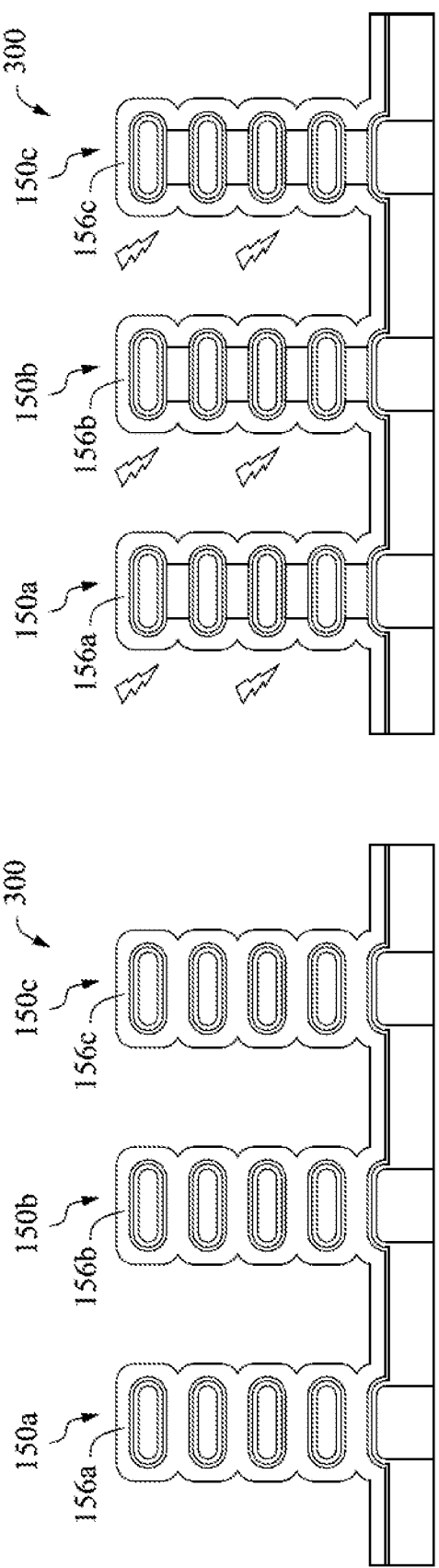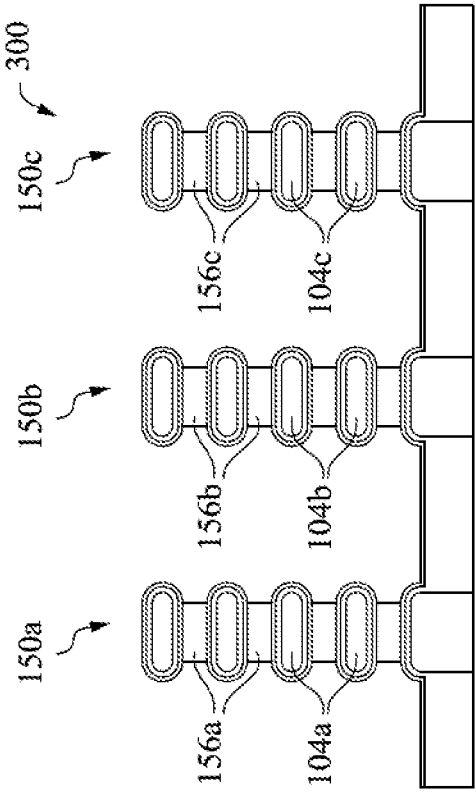

INNER FILLER LAYER FOR MULTI-PATTERNED METAL GATE FOR NANOSTRUCTURE TRANSISTOR

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Nanostructure transistors can assist in increasing computing power because the nanostructure transistors can be very small and can have improved functionality over convention transistors. A nanostructure transistor may include a plurality of semiconductor nanostructures (e.g. nanowire, nanosheet, etc.) that act as the channel regions for a transistor. The gate electrode may include various gate metals surrounding the semiconductor nanostructures. It can be difficult to obtain gate electrodes with desired characteristics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1L are perspective views of an integrated circuit at various stages of processing, in accordance with some embodiments.

FIGS. 3A-3C are cross-sectional views of the integrated circuit, at various stages of processing, in accordance with some embodiments.

DETAILED DESCRIPTION

Figure 1L:
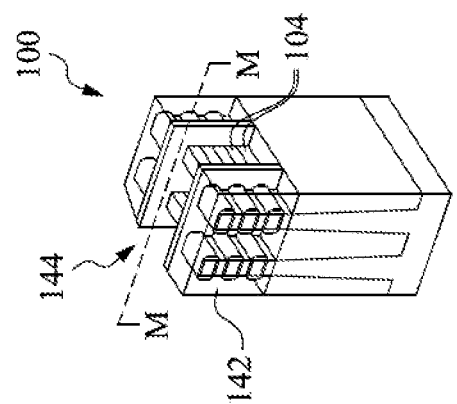

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least some embodiments. Thus, the appearances of the phrases "in one embodiment", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit including nanostructure transistors each having a plurality of semiconductor nanostructures corresponding to channel regions of the transistor. Embodiments of the present disclosure provide improved gate metal layer formation for transistors having different threshold voltages. In particular, an inter-sheet filler layer is formed between the semiconductor nanostructures of two transistors. The inter-sheet filler layer is completely removed from between the semiconductor nanostructures of the first transistor prior to deposition of a first gate metal. The inter-sheet filler layer is removed from the sides, but not from between the semiconductor nanostructures of the second type of transistor. The first gate metal layer is then deposited. The first gate metal layer fills the gaps between the semiconductor nanostructures of the first type of transistor. The first gate metal layer is prevented by the inter-sheet filler layer from filling the gaps between the semiconductor nanostructures of the second type of transistor. Because the first gate metal layer never enters the gaps between semiconductor nanostructures of the second transistor, the semiconductor nanostructures of the second transistor are not exposed to a prolonged etching process to entirely remove the first gate metal from between the semiconductor nanostructures. The result is that gate dielectric materials of the second transistor are not eroded by the etching process. Furthermore, the first and second transistors have more distinct threshold voltages. The performance of the transistors and overall wafer yields are improved.

FIGS. 1A-1L are perspective views of an integrated circuit 100 at successive intermediate stages of processing, according to some embodiments. FIGS. 1A-1L illustrate an exemplary process for producing an integrated circuit that includes nanostructure transistors. FIGS. 1A-1L illustrate how these transistors can be formed in a simple and effective process in accordance with principles of the present disclosure. Other process steps and combinations of process steps can be utilized without departing from the scope of the present disclosure. The nanostructure transistors can include gate all around transistors, multi-bridge transistors, nanosheet transistors, nanowire transistors, or other types of nanostructure transistors.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure transistor structure.

In FIG. 1A the integrated circuit 100 includes a semiconductor substrate 102. In some embodiments, the substrate 102 includes a single crystalline semiconductor layer on at least a surface portion. The substrate 102 may include a single crystalline semiconductor material such as, but not limited to Si, Ge, SiGe, GaAs, InSb, GaP, GaSb, InAlAs, InGaAs, GaSbP, GaAsSb and InP. In the example process described herein, the substrate 102 includes Si, though other semiconductor materials can be utilized without departing from the scope of the present disclosure.

The substrate 102 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The substrate 102 may include various regions that have been suitably doped with impurities (e.g., p-type or n-type conductivity). The dopants are, for example boron ($BF_2$) for an n-type transistor and phosphorus for a p-type transistor.

The integrated circuit 100 includes a plurality of semiconductor nanostructures 104. The semiconductor nanostructures 104 are layers of semiconductor material. The semiconductor nanostructures 104 correspond to the channel regions of the nanostructure transistors that will result from the process described. The semiconductor nanostructures 104 are formed over the substrate 102. The semiconductor nanostructures 104 may include one or more layers of Si, Ge, SiGe, GaAs, InSb, GaP, GaSb, InAlAs, InGaAs, GaSbP, GaAsSb or InP. In some embodiments, the semiconductor nanostructures 104 are the same semiconductor material as the substrate 102. Other semiconductor materials can be utilized for the semiconductor nanostructures 104 without departing from the scope of the present disclosure. In a non-limiting example described herein, the semiconductor nanostructures 104 and the substrate 102 are silicon. The nanostructures 104 can include nanosheets, nanowires, or other types of suitable structures or shapes for acting as channel regions of a nanostructure transistor.

The integrated circuit 100 includes a plurality of sacrificial semiconductor nanostructures 106 positioned between the semiconductor nanostructures 104. The sacrificial semiconductor nanostructures 106 include a different semiconductor material than the semiconductor nanostructures 104. In an example in which the semiconductor nanostructures 104 include silicon, the sacrificial semiconductor nanostructures 106 may include SiGe.

In some embodiments, the semiconductor nanostructures 104 and the sacrificial semiconductor nanostructures 106 are formed by alternating epitaxial growth processes from the semiconductor substrate 102. Alternating epitaxial growth processes are performed until a selected number of semiconductor nanostructures 104 and sacrificial semiconductor nanostructures 106 have been formed.

In FIG. 1A, there are three semiconductor nanostructures 104. However, in practice, there may be many more semiconductor nanostructures 104 than three. For example, each gate all around transistor may include between 3 and 10 semiconductor nanostructures 104. Other numbers of semiconductor nanostructures 104 can be utilized without departing from the scope of the present disclosure.

The vertical thickness of the semiconductor nanostructures 104 can be between 2 nm and 15 nm. The thickness of the sacrificial semiconductor nanostructures 106 can be between 5 nm and 15 nm. Other thicknesses and materials can be utilized for the semiconductor nanostructures 104 and the sacrificial semiconductor nanostructures 106 without departing from the scope of the present disclosure.

In some embodiments, the sacrificial semiconductor nanostructures 106 correspond to a first sacrificial epitaxial semiconductor region having a first semiconductor composition. In subsequent steps, the sacrificial semiconductor nanostructures 106 will be removed and replaced with other materials and structures. For this reason, the semiconductor nanostructures 106 are described as sacrificial.

In FIG. 1B, a trench 108 has been formed in the sacrificial semiconductor nanostructures 106, the semiconductor nanostructures 104, and in the substrate 102. The trench 108 can be formed by depositing a hard mask layer 110 on the top sacrificial semiconductor nanostructure 106. The hard mask layer 110 is patterned and etched using standard photolithography processes. After the hard mask layer 110 has been patterned and etched, the sacrificial semiconductor nanostructures 106, the semiconductor nanostructures 104, and the substrate 102 are etched at the locations that are not covered by the hard mask layer 110. The etching process results in formation of the trenches 108. The etching process can include multiple etching steps. For example, a first etching step can etch the top sacrificial semiconductor nanostructure. A second etching step can etch the top semiconductor nanostructure 104. These alternating etching steps can repeat until all of the sacrificial semiconductor nanostructures 106 and semiconductor nanostructures 104 are etched at the exposed regions. The final etching step may etch the substrate 102. In other embodiments, the trench 108 may be formed in a single etching process.

The trench 108 defines three columns or stacks semiconductor nanostructures 104 and sacrificial semiconductor nanostructures 106. Each of these columns or stacks corresponds to a separate gate all around transistor that will eventually result from further processing steps described herein. In particular, the semiconductor nanostructures 104 in each column or stack will correspond to the channel regions of a particular gate all around nanostructure transistor.

The hard mask layer 110 can include one or more of aluminum, AlO, SiN, or other suitable materials. The hard mask layer 110 can have a thickness between 5 nm and 50 nm. The hard mask layer 110 can be deposited by a PVD process, an ALD process, a CVD process, or other suitable deposition processes. The hard mask layer 110 can have other thicknesses, materials, and deposition processes without departing from the scope of the present disclosure.

In FIG. 1C, shallow trench isolation regions 112 have been formed in the trenches 108. The shallow trench isolation regions 112 can be formed by depositing a dielectric material in the trenches 108 and by recessing the deposited dielectric material so that a top surface of the dielectric material is lower than the lowest sacrificial semiconductor nanostructure 106.

The shallow trench isolation regions 112 can be utilized to separate individual transistors or groups of transistors formed in conjunction with the semiconductor substrate 102. The dielectric material for the shallow trench isolation regions 112 may include silicon oxide, silicon nitride, silicon oxynitride (SiON), SiOCN, SiCN, fluorine-doped silicate glass (FSG), or a low-K dielectric material, formed by LPCVD (low pressure chemical vapor deposition), plasma enhanced-CVD or flowable CVD. Other materials and structures can be utilized for the shallow trench isolation regions 112 without departing from the scope of the present disclosure. In FIG. 1D, the material of the shallow trench isolation has been etched back via one or more wet or dry etching processes.

In FIG. 1E, a cladding layer 114 has been deposited on the sides of the semiconductor nanostructures 104 and the sacrificial semiconductor nanostructures 106 and on the hard mask layer 110. The cladding layer 114 defines gaps 116 between claddings 114 of adjacent columns of semiconductor nanostructures. The cladding layer 114 can be formed by an epitaxial growth from the semiconductor nanostructures 104, the sacrificial semiconductor nanostructures 106, and the hard mask layer 110. Alternatively, the cladding layer 114 can be deposited by a chemical vapor deposition (CVD) process. Other processes can be utilized for depositing the cladding layer 114 without departing from the scope of the present disclosure.

In FIG. 1F a layer of polysilicon 126 has been deposited on the top surfaces of the cladding layer 114, the top semiconductor nanostructure 104, and on the high-K dielectric layer 124. The layer of polysilicon 126 can have a thickness between 20 nm and 100 nm. The layer of polysilicon 126 can be deposited by an epitaxial growth, a CVD process, a physical vapor deposition (PVD) process, or an ALD process. Other thicknesses and deposition processes can be used for depositing the layer polysilicon 126 without departing from the scope of the present disclosure.

In FIG. 1F a dielectric layer 128 has been deposited on the layer of polysilicon 126. A dielectric layer 130 has been formed on the dielectric layer 128. In one example, the dielectric layer 128 includes silicon nitride. In one example, the dielectric layer 130 includes silicon oxide. The dielectric layers 128 and 130 can be deposited by CVD. The dielectric layer 128 can have a thickness between 5 nm and 15 nm. The dielectric layer 130 can have a thickness between 15 nm and 50 nm. Other thicknesses, materials, and deposition processes can be utilized for the dielectric layers 128 and 130 without departing from the scope of the present disclosure.

The dielectric layers 128 and 130 have been patterned and etched to form a hard mask for the layer of polysilicon 126. The dielectric layers 128 and 130 can be patterned and etched using standard photolithography processes. After the dielectric layers 128 and 130 have been patterned and etched to form the hard mask, the layer of polysilicon 126 is etched so that only the polysilicon directly below the dielectric layers 128 and 130 remains. The result is a polysilicon fin. Additionally, the cladding layer 114 is removed at all locations except directly under the remaining portion of the layer of polysilicon 126. The cladding layer 114 can be removed in a same etch process that patterns the layer of polysilicon. Alternatively, the cladding layer 114 can be removed in a separate etching process after etching the layer of polysilicon 126.

In FIG. 1G, the sacrificial semiconductor nanostructures 106 are removed from the areas not below the layer of polysilicon 126. The sacrificial semiconductor nanostructures 106 can be removed using an etchant that selectively etches the sacrificial semiconductor nanostructures 106 with respect to the semiconductor nanostructures 104. In some embodiments, the sacrificial semiconductor nanostructures 106 may also be recessed below the dummy gate structure formed by the layer polysilicon 126, and the dielectric layers 128 and 130. This may facilitate forming inner spacers into the recessed regions.

In FIG. 1H, a gate spacer layer 132 has been deposited on the exposed top surfaces of the semiconductor nanostructures 104, as well as on the sidewalls of the layer of polysilicon 126 and the dielectric layers 128 and 130. In one example, the gate spacer layer 132 includes SiCON. The gate spacer layer 132 can be deposited by CVD, PVD, or ALD. Other materials and deposition processes can be utilized for the gate spacer layer 132 without departing from the scope of the present disclosure.

Figure 1K:
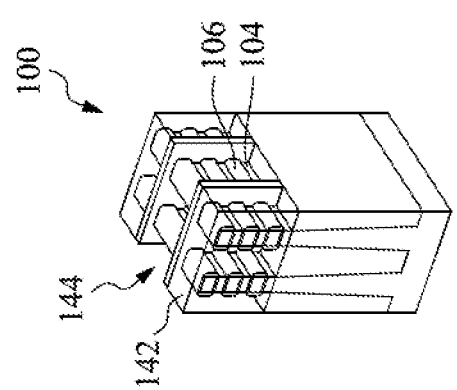
Figure 1J:
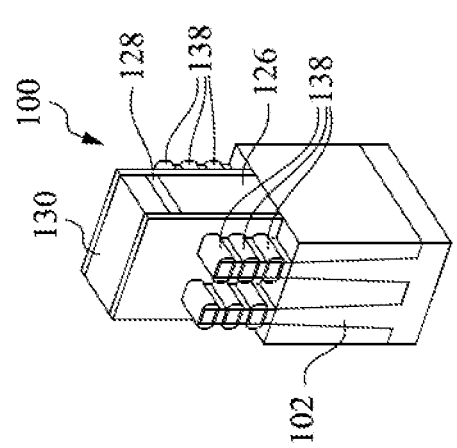
Figure 1I:
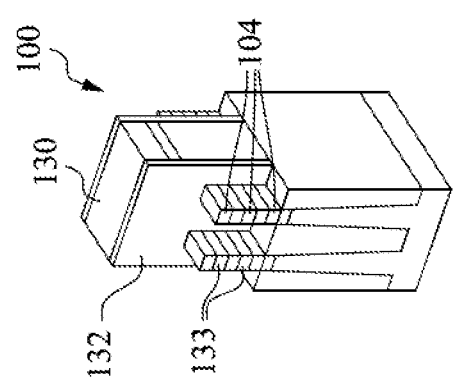

In FIG. 1I, and etching processes been performed to remove portions of the gate spacer layer 132. The etching process selectively etches in the downward direction. The result is that the gate spacer layer 132 is removed from on top of the dielectric layer 130 and from the top of the semiconductor nanostructures 104 in the areas not covered by the polysilicon layer 126. In FIG. 1I, a spacer layer 133 has been deposited between the exposed portions of the semiconductor nanostructures 104. The spacer layer 133 can be deposited by an ALD process, a CVD process, or other suitable processes. In one example, the spacer layer 133 includes silicon nitride. The spacer layer 133 may be formed simultaneously with or separately from the gate spacer layer 132. Other processes, structures, and materials can be utilized for forming the gate spacer layer 132 and the spacer layer 133 without departing from the scope of the present disclosure.

As described previously, when the sacrificial semiconductor nanostructures 106 are removed outside the dummy gate structure, the sacrificial semiconductor nanostructures 106 may be recessed below the dummy gate structure. When the spacer layer 133 is formed, a portion of the spacer layer 133 is formed in the recesses left by the sacrificial semiconductor nanostructures 106 beneath the dummy gate structure. The spacer layer 133 and a recess can help ensure that source and drain regions will not directly contact gate metals that will be formed subsequently. In this sense, a portion of the spacer layer 133 may also act as an inner spacer layer.

In FIG. 1J source and drain regions 138 have been formed. The source and drain regions 138 include a semiconductor material. The source and drain regions 138 can be grown epitaxially from the semiconductor nanostructures 104. The source and drain regions 138 can be epitaxially grown from the semiconductor nanostructures 104 or from the substrate 102. The source and drain regions 138 can be doped with N-type dopants species in the case of N-type transistors. The source and drain regions 138 can be doped with P-type dopant species in the case of P-type transistors. The doping can be performed in-situ during the epitaxial growth.

The source and drain regions 138 can have different structures and can be formed with different process than described above. For example, the spacer layer 133 may be removed between the exposed portions of the nanostructures 104, while leaving the portion of the spacer layer 133 described as the inner spacer layer below the dummy gate structure to prevent the source and drain regions 138 from directly contacting subsequently formed gate electrodes. An epitaxial growth may then be performed to grow source and drain regions 138 from the exposed portions of the nanostructures 104. In this case, the source and drain material will fill the spaces between the exposed portions of the nanostructures 104. In another example, the exposed portions of the nanostructures 104 may be entirely removed. The source and drain regions 138 can then be epitaxially grown from the substrate 102 or otherwise deposited or formed.

In FIG. 1K an etching process has been performed to remove the dielectric layers 128 and 130 from above the layer of polysilicon 126. The etching process also removes a portion of the gate spacer layer 132. Multiple etching steps can be utilized to remove the dielectric layers 128 and 130 and the portion of the gate spacer layer 132.

After removal of the dielectric layers 128 and 130, an interlevel dielectric layer 142 has been deposited. The interlevel dielectric layer 142 can include silicon oxide. The interlevel dielectric layer 142 can be deposited by CVD, ALD, or other suitable processes. Other materials and processes can be utilized for the interlevel dielectric layer 142 without departing from the scope of the present disclosure. A CMP process may be performed to make the top surface of the interlevel dielectric layer 142 planar with the top surface of the polysilicon layer 126.

After formation of the interlevel dielectric layer 142, an etching process has been performed to remove the polysilicon layer 126. The removal of the polysilicon layer 126 forms a gate trench 144. The gate trench 144 exposes the semiconductor nanostructures 104 and the portions of the sacrificial semiconductor nanostructures 106 that were not removed.

In FIG. 1L, the remaining portions of the sacrificial semiconductor nanostructures 106 have been removed from between the semiconductor nanostructures 104 by selectively etching the sacrificial semiconductor nanostructures 106 with respect to the semiconductor nanostructures 104.

FIGS. 1M-1Y are cross-sectional views of the integrated circuit 100 at intermediate stages of processing, according to some embodiments. The cross-sectional views of FIGS. 1M-1Y taken along cut lines M shown in FIG. 1L. The cross-sectional views show the semiconductor nanostructures 104a, 104b, and 104c, of three different gate all around transistors 150a, 150b, and 150c. While FIG. 1L shows the formation of two transistors, FIGS. 1M-1Y show three transistors 150a, 150b, and 150c because some embodiments provide three types of transistors each having a different threshold voltage.

Figure 1M:
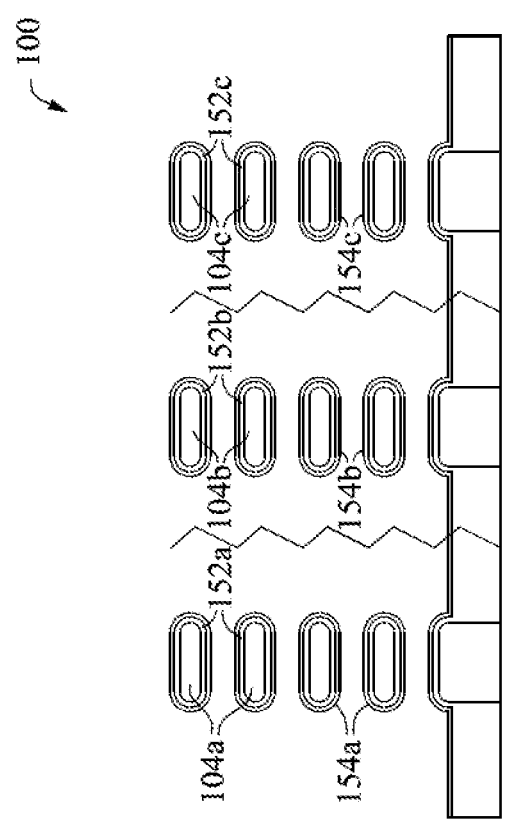
FIGS. 1M-1Y are cross-sectional views of the integrated circuit, at various stages of processing, in accordance with some embodiments.

In FIG. 1M, interfacial dielectric layer 152a, 152b, and 152c are formed on the semiconductor nanostructures 104a, 104b, and 104 c. The interfacial dielectric layer 152a is formed on the semiconductor nanostructures 104a. The interfacial dielectric layer 152b is formed on the semiconductor nanostructures 104b. The interfacial dielectric layer 152c is deposited on the semiconductor nanostructures 104c. The interfacial dielectric layers 152a-c are in direct contact with the semiconductor nanostructures 104a-c.

The interfacial dielectric layers 152a-c can include a dielectric material such as silicon oxide, silicon nitride, or other suitable dielectric materials. The interfacial dielectric layers 152a-c can include a comparatively low-K dielectric with respect to high-K dielectric materials such as hafnium oxide or other high-K dielectric materials that may be used in gate dielectrics of transistors.

The interfacial dielectric layers 152a-152c can be formed by a thermal oxidation process, a chemical vapor deposition (CVD) process, or an atomic layer deposition (ALD) process. The interfacial dielectric layer can have a thickness between 0.5 nm and 2 nm. One consideration in selecting a thickness for the interfacial dielectric layer is to leave sufficient space between the semiconductor nanostructures 104a-c for gate metals, as will be explained in more detail below. Other materials, deposition processes, and thicknesses can be utilized for the interfacial dielectric layer without departing from the scope of the present disclosure. In some embodiments, the interfacial dielectric layers 152a-c are formed simultaneously in a same deposition process.

Figure 1N:
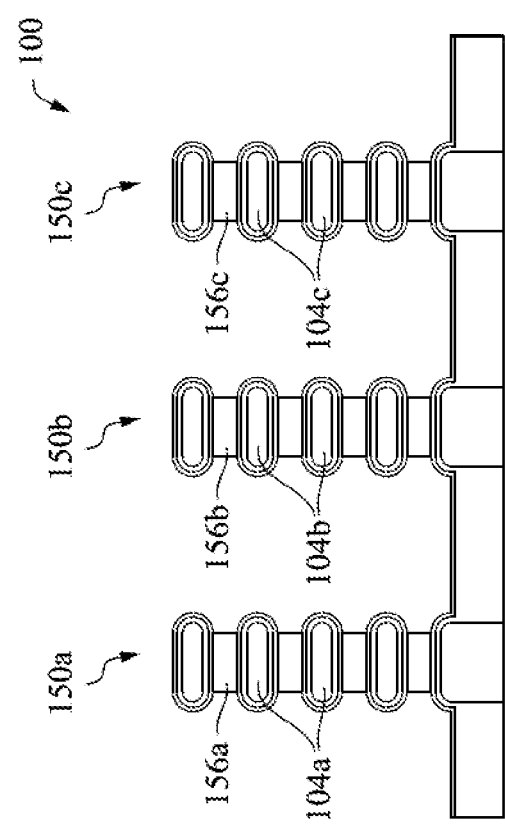
Figure 1O:
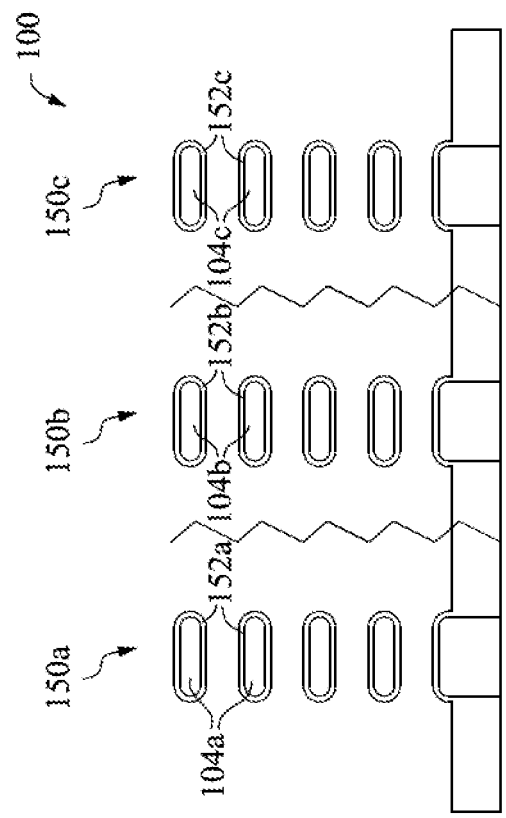

In FIG. 1N, high-K dielectric layers 154a, 154b, and 154c have been formed on the semiconductor nanostructures 104a, 104b, and 104c of the transistors 150a, 150b, and 150c. In particular, the high-K gate dielectric layer 154a is formed on the interfacial dielectric layer 152a on the semiconductor nanostructures 104a of the transistor 150a. The high-K gate dielectric layer 154b is formed on the interfacial dielectric layer 152b on the semiconductor nanostructures 104b of the transistor 150b. The high-K gate dielectric layer 154c is formed on the interfacial dielectric layer 152c on the semiconductor nanostructures 104c of the transistor 150c. In some embodiments, the high-K gate dielectric layers 154a-154c are formed simultaneously in a same deposition process.

The high-K gate dielectric layers 154a-c and the interfacial dielectric layers 152a-c physically separate the semiconductor nanostructures 104 from the gate metals that will be deposited in subsequent steps. The high-K gate dielectric layers 154a-c and the interfacial dielectric layers 152a-152c isolate the gate metals from the semiconductor nanostructures 104a-c that correspond to the channel regions of the transistors 150a-c.

The high-K gate dielectric layers 154a-c includes one or more layers of a dielectric material, such as $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layers 154a-c may be formed by CVD, ALD, or any suitable method. In some embodiments, the high-K gate dielectric layers 154a-c are formed using a highly conformal deposition process such as ALD in order to ensure the formation of a gate dielectric layer having a uniform thickness around each semiconductor nanostructure 104. In some embodiments, the thickness of the high-k dielectric is in a range from about 1 nm to about 3 nm. Other thicknesses, deposition processes, and materials can be utilized for the high-K gate dielectric layers 154a-c without departing from the scope of the present disclosure. The high-K gate dielectric layers 154a-154c may include a first layer that includes $HfO_2$ with dipole doping including La and Mg, and a second layer including a higher-K ZrO layer with crystallization.

The interfacial dielectric layer 152a and the high K gate dielectric layer 154a collectively form a gate dielectric of the transistor 150a. The interfacial dielectric layer 152b and the high K gate dielectric layer 154b collectively form a gate dielectric of the transistor 150b. The interfacial dielectric layer 152c and the high K gate dielectric layer 154c collectively form a gate dielectric of the transistor 150c.

Prior to proceeding with further discussion regarding the formation of the transistors 150a, 150b, and 150c, it is beneficial to discuss some aspects that can affect the work function of the transistors 150a-c. There may be various reasons that it is beneficial to have multiple types of transistors with different threshold voltages. For example, transistors with higher threshold voltages can typically withstand higher voltages across their terminals. Such high threshold voltage transistors may be utilized as I/O transistors coupled to the terminals of the integrated circuit 100. These I/O transistors may be subject to particularly high voltages from circuits external to the integrated circuit, or due to the buildup of electrostatic charges. Lower threshold voltage transistors may be utilized as core transistors of the integrated circuit 100. The core transistors may be utilized as the logic and computation centers of the integrated circuit 100. To reduce power consumption, the core transistors may receive relatively small supply voltages and, thus, may benefit from lower threshold voltages. There may be three or more different types of transistors having different threshold voltages in the integrated circuit 100.

The work function associated with the gate electrodes of the transistors strongly affects the threshold voltages of the transistors. The work function of the transistor can be selectively increased or decreased based on the material or combinations of materials acting as the gate electrode. The gate electrode of a first type of transistor may include only a first gate metal and thus may have a first work function. The gate electrode of the second type of transistor may include both the first gate metal and a second gate metal and, thus, may have a second work function different than the first work function. The gate electrode of a third type of transistor may include both the first gate metal, the second gate metal, and a third gate metal and, thus, may have a third work function different than the first and second work functions.

If the various gate metals are deposited in blanket deposition on the gate dielectrics of each of the types of transistors, then some of the gate metals will be removed from between the semiconductor nanostructures of some of the types of transistors in order to produce the differing work functions. However, removing a gate metal from between the semiconductor nanostructures of a transistor that is not intended to include that gate metal can result in some drawbacks. For example, it can be very difficult to entirely remove the gate metal from between the semiconductor nanostructures of the transistor. Particularly long and potent etching processes may be utilized to remove the gate metal from between the semiconductor nanostructures of a particular type of transistor. Not only may removal be incomplete, but the thickness of the high K gate dielectric at the sides of the semiconductor nanostructures may be significantly reduced as a result of the etching processes. The reduction in the thickness of the high K gate dielectric can seriously impact the performance of the transistor. The presence of a gate metal remaining between the semiconductor nanostructures of a transistor for which the gate metal is not intended to be part of the gate electrode can result in the work function not being as distinct as desired compared to other types of transistors. In short, the deposition of a gate metal between the semiconductor nanostructures of a transistor for which the gate metal is intended to be removed can result in serious drawbacks in terms of work function distinction and overall transistor function.

Some embodiments of the present disclosure overcome the drawbacks described above by utilizing an easily removable inter-sheet filler layer to block the deposition of gate metals between the semiconductor nanostructures of transistors for which the gate metals not intended to remain part of the gate electrode. The inter-sheet filler layer can be deposited between the semiconductor nanostructures 104a-c of each of the transistors 150a-c after deposition of the high K gate dielectric layers 154a-c. The inter-sheet filler layer can then be selectively and successively removed from between each type of transistor between gate metal deposition processes so that gate metals are never deposited between the semiconductor nanostructures of transistors for which the gate metal is not intended to be part of the gate electrode. This is described in more detail with respect to subsequent figures. The result is multiple types of transistors with distinct threshold voltages and robust gate dielectrics. Wafer yields and device performance significantly increased In FIG. 1O, inter-sheet filler layers 156a-156c have been deposited on the semiconductor nanostructures 104a-c. The inter-sheet filler layer 156a is deposited on the high K dielectric layer 154a on the semiconductor nanostructures 104a of the transistor 150a. The inter-sheet filler layer 156a fills the spaces between the semiconductor nanostructures 104a. The inter-sheet filler layer 156b is deposited on the high K dielectric layer 154b on the semiconductor nanostructures 104b of the transistor 150b. The inter-sheet filler layer 156b fills the spaces between the semiconductor nanostructures 104b. The inter-sheet filler layer 156c is deposited on the high K dielectric layer 154c on the semiconductor nanostructures 104c of the transistor 150c. The inter-sheet filler layer 156c fills the spaces between the semiconductor nanostructures 104c.

Figure 1P:
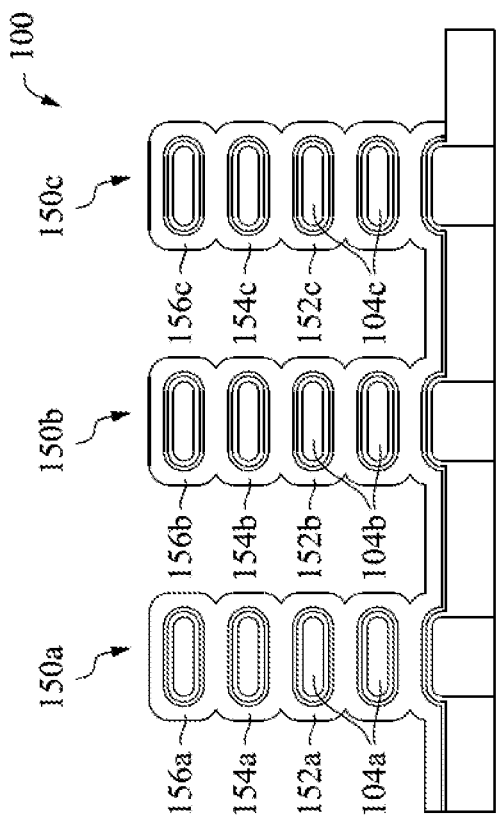

The inter-sheet filler layers 156a-c can include materials with a high etch selectivity relative to the material of the high K-gate dielectric layers 154a-c. In some embodiments, the inter-sheet filler layers 156a-c can include Si, AlTiCN, TiC, AlC, TiN, AlN, $Al_2O_3$, or $SiO_2$. The inter-sheet filler layers may be deposited by an ALD process. Alternatively, the inter-sheet filler layers 156a-c may be deposited by a CVD process, a PVD process, or other suitable deposition processes. The thickness of the inter-sheet filler layers 156a-c is selected to ensure that the inter-sheet filler layers 156a-c entirely fill the gaps between adjacent semiconductor nanostructures 104a-c of each of the transistors 150a-c. In one example, after deposition of the high K gate dielectric layer 154a on the semiconductor nanostructures 104a, the vertical gap between the high K gate dielectric layer 154a of adjacent nanostructures 104a may be between 20 Å and 50 Å, in some examples. Accordingly, in some embodiments, the inter-sheet filler layers 156a-c may have a thickness between 20 Å and 15 Å. Other materials, deposition processes, and thicknesses can be utilized for the inter-sheet filler layers 156a-c without departing from the scope of the present disclosure. In some embodiments, the inter-sheet filler layers 156a-c may be deposited simultaneously in a single deposition process. In FIG. 1P, an anisotropic etching process has been performed on the inter-sheet filler layers 156a-c. The etching process selectively etches in the vertical direction. The result is that the inter-sheet filler layers 156a-c are removed from the sides of the semiconductor nanostructures 104a-c and from the top surface of the top nanostructure 104a-c in each transistor 150a-c. The inter-sheet filler layers 156a-c remain between the semiconductor nanostructures 104a-c. The etching process can include a wet etch, a dry etch, or combination of wet and dry etches. In some embodiments, the etching process includes a sidewall conversion treatment including low-temperature $O_2$ exposure, or $H_2O_2$ deionized water wet chemical oxidation. The wet etch further includes a selected wet etch with MR, MR3, or MR1. A subsequent dry etching process can include etching with WCl5 or TACl5 based selected oxide etch with $CF_4$ or $C_2F_6$ plasma. The dry etch can further include an anisotropic atomic radical treatment including $H_2$, $F_2$, or other suitable etches. Other etching processes or combinations of etching processes can be utilized to remove the side portions of the inter-sheet filler layers 156a-c without departing from the scope of the present disclosure.

Figure 1Q:
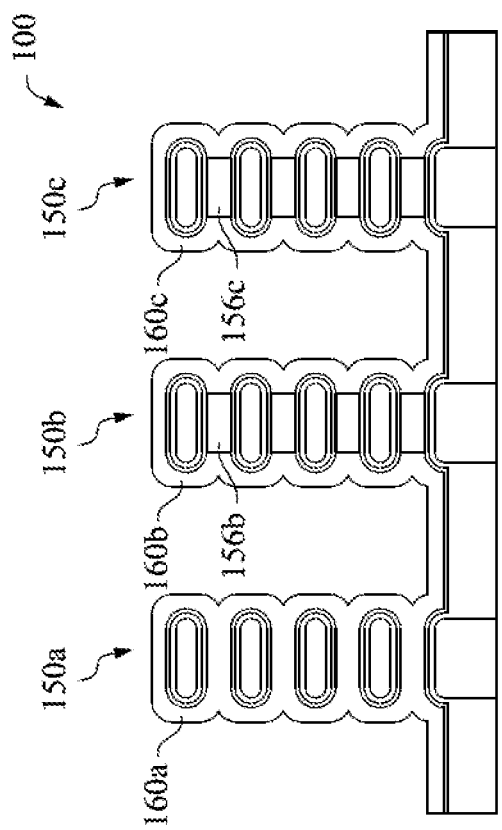

In FIG. 1Q, a mask 158 has been formed and patterned. The mask 158 covers the semiconductor nanostructures 104b and 104c of the transistors 150b and 150c. The mask exposes the semiconductor nanostructures 104a of the transistor 150a. The mask can include photo resist or hard mask materials patterned using photolithography processes.

An etching process is performed in the presence of the mask 158. The etching process entirely removes the inter-sheet filler layer 156a from between the semiconductor nanostructures 104a. The etching process can include a wet etch, a dry etch, or a combination of wet and dry etching processes.

Figure 1R:
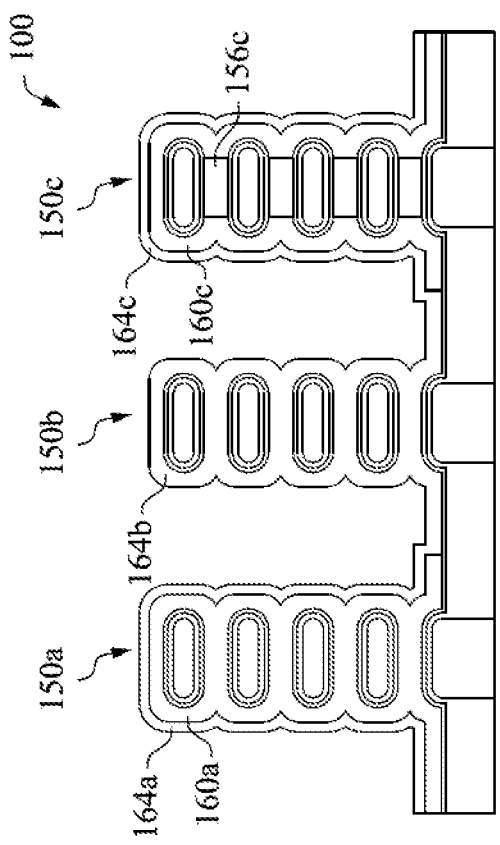
Figure 1S:
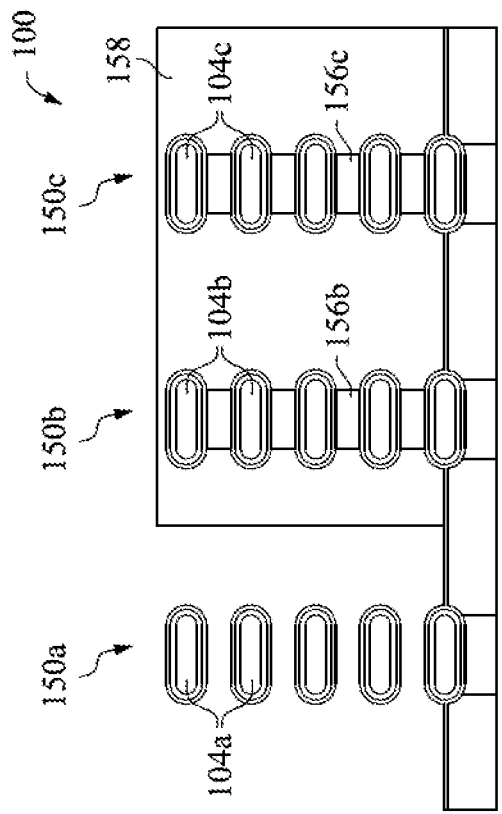

In FIG. 1R, the mask 158 has been removed. The mask 158 can be removed by any suitable process for moving a photoresist or hard mask layer depending on the type of the mask 158. After removal of the mask 158, first gate metal layers 160a-160c are deposited on the semiconductor nanostructures 104a-c. In particular, the first gate metal layer 160a is deposited directly on the high K gate dielectric 154a of the transistor 150a. The first gate metal layer 160a entirely fills the gaps between the semiconductor nanostructures 104a. The first gate metal layer 160b is deposited directly on the high K gate dielectric 154b of the transistor 150b. However, the first gate metal layer 160b is not deposited entirely between the semiconductor nanostructures 104b because of the presence of the inter-sheet filler layer 156b between the semiconductor nanostructures 104b. The presence of the inter-sheet filler layer 156b prevents or blocks deposition of the first gate metal layer 160b between the semiconductor nanostructures 104b. The first gate metal layer 160c is deposited directly on the high K gate dielectric 154c of the transistor 150c. However, the first gate metal layer 160c is not deposited entirely between the semiconductor nanostructures 104c because of the presence of the inter-sheet filler layer 156c between the semiconductor nanostructures 104c. The presence of the inter-sheet filler layer 156c prevents or blocks deposition of the first gate metal layer 160c between the semiconductor nanostructures 104c.

In some embodiments, the first gate metal layers 160a-c includes titanium nitride. In some embodiments, the first gate metal layers 160a-c include Ru, TiAl, WCN, tantalum, or other suitable materials. The first gate metal layers 160a-c can be deposited by ALD, PVD, CVD, or other suitable deposition processes. The first gate metal layers 160a-c can have thicknesses between 20 Å and 50 Å. Other materials, deposition processes, and thicknesses can be utilized for the first gate metal layers 160a-c without departing from the scope of the present disclosure.

In Figure is, a mask 162 has been formed and patterned. The mask 162 covers the transistors 150a and 150c. The mask exposes the transistor 150b. The mask 162 can include photo resist or hard mask materials patterned using photolithography processes.

An etching process is performed in the presence of the mask 162. The etching process entirely removes the first gate metal 160b and the inter-sheet filler layer 156b from between the semiconductor nanostructures 104b. The etching process can include a wet etch, a dry etch, or a combination of wet and dry etching processes.

Figure 1T:
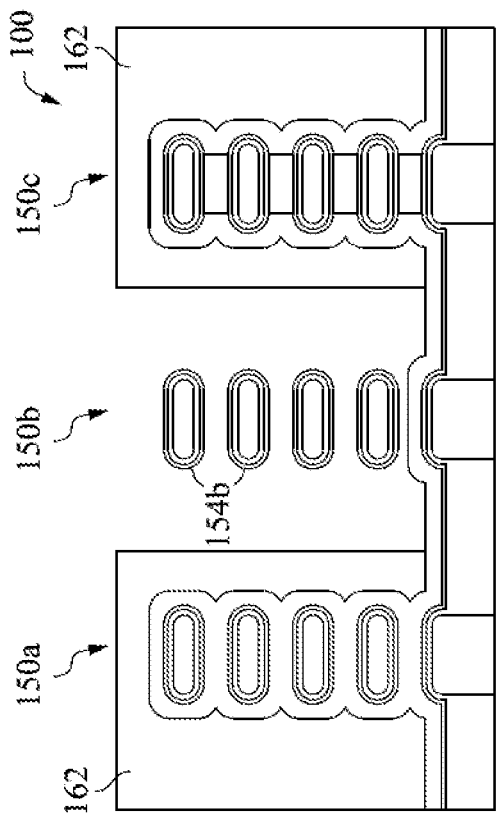

In FIG. 1T, the mask 162 has been removed. The mask 162 can be removed by any suitable process for moving a photoresist or hard mask layer depending on the type of the mask 162. After removal of the mask 162, second gate metal layers 164a-c are deposited on the semiconductor nanostructures 104a-c. In particular, the second gate metal layer 164a is deposited directly on the first gate metal layer 160a of the transistor 150a. The second gate metal layer 164b is deposited directly on the high K gate dielectric 154b of the transistor 150b. The second gate metal layer 164b entirely fills the gaps between the semiconductor nanostructures 104b of the transistor 150b. The second gate metal layer 164c is deposited directly on the first gate metal layer 160c of the transistor 150c.

In some embodiments, the second gate metal layers 164a-c includes titanium nitride. In some embodiments, the second gate metal layers 164a-c include Ru, TiAl, WCN, tantalum, or other suitable materials. In some embodiments, the second gate metal layers 164a-c include a different material than the first gate metal layers 160a-c. The second gate metal layers 164a-c can be deposited by ALD, PVD, CVD, or other suitable deposition processes. The second gate metal layers 164a-c can have thicknesses between 20 Å and 50 Å. Other materials, deposition processes, and thicknesses can be utilized for the second gate metal layers 164a-c without departing from the scope of the present disclosure.

Figure 1U:
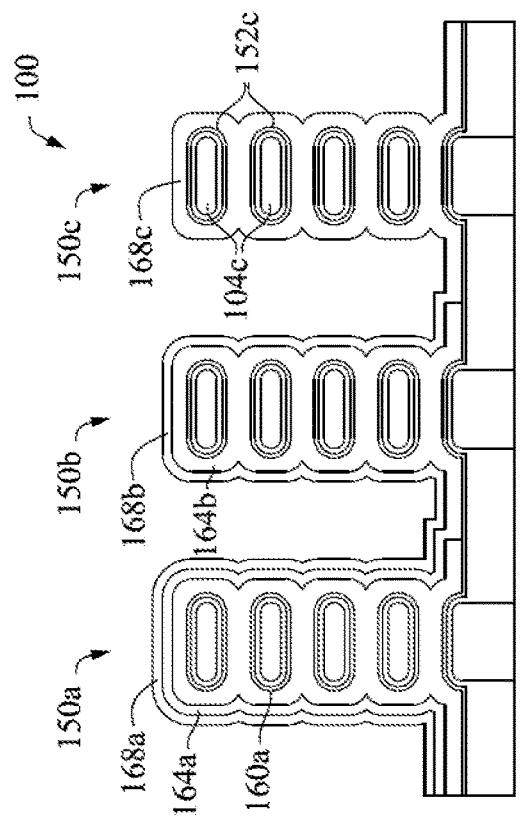

In FIG. 1U, a mask 166 has been formed and patterned. The mask 166 covers the transistors 150a and 150b. The mask 166 exposes the transistor 150c. The mask 166 can include photo resist or hard mask materials patterned using photolithography processes.

An etching process is performed in the presence of the mask 166. The etching process entirely removes the second gate metal layer 164c, the first gate metal layer 160c, and the inter-sheet filler layer 156c from between the semiconductor nanostructures 104c. The etching process can include a wet etch, a dry etch, or a combination of wet and dry etching processes.

Figure 1V:
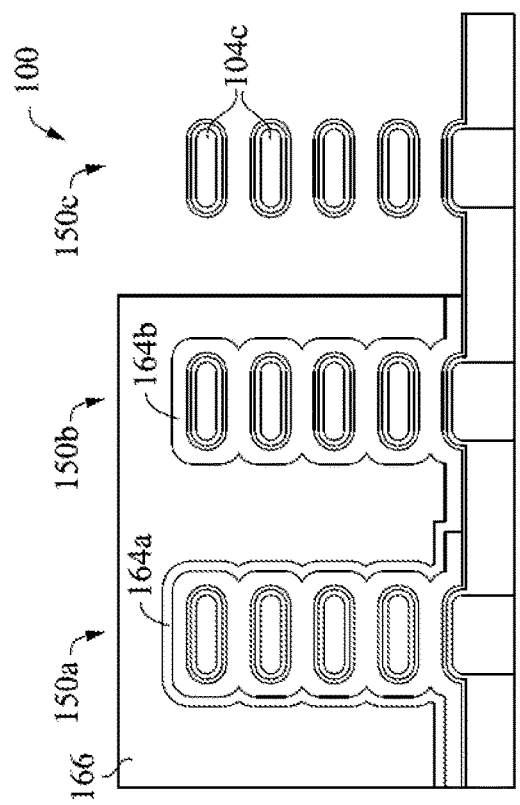

In FIG. 1V, the mask 166 has been removed. The mask 166 can be removed by any suitable process for moving a photoresist or hard mask layer depending on the type of the mask 166. After removal of the mask 166, third gate metal layers 168a-c are deposited on the semiconductor nanostructures 104a-c. In particular, the third gate metal layer 168a is deposited directly on the second gate metal layer 164a of the transistor 150a. The third gate metal layer 168b is deposited directly on second gate metal layer 164b of the transistor 150b. The third gate metal layer 168c is deposited directly on the high-K gate dielectric layer 154c of the transistor 150c. The third gate metal layer 168c entirely fills the gaps between the semiconductor nanostructures 104c of the transistor 150c.

In some embodiments, the second gate metal layers 164a-c includes TiAl. In some embodiments, the second gate metal layers 164a-c include Ru, WCN, tantalum, titanium nitride, or other suitable materials. In some embodiments, the third gate metal layers 168a-c include a different material than the one or both of the second gate metal layers 164a-c and the first gate metal layers 160a-c. The third gate metal layers 168a-c can be deposited by ALD, PVD, CVD, or other suitable deposition processes. In some embodiments, the third gate metal layers 168a-c are deposited simultaneously in a single deposition process. The third gate metal layers 168a-c can have thicknesses between 20 Å and 50 Å. Other materials, deposition processes, and thicknesses can be utilized for the third gate metal layers 168a-c without departing from the scope of the present disclosure.

Figure 1W:
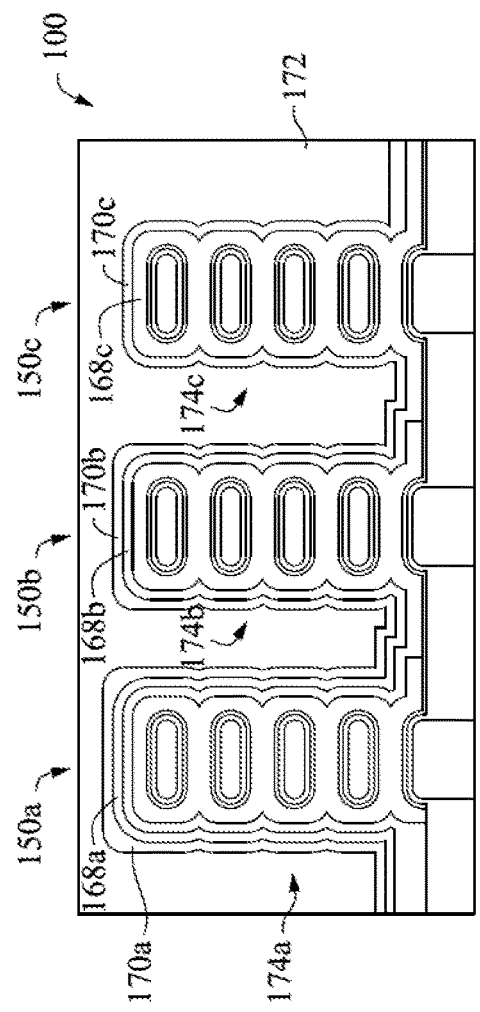

In FIG. 1W, glue layers 170a-c have been deposited on the third gate metal layers 168a-c of the transistors 150a-c. A gate fill material 172 has been deposited covering the glue layers 170a-c. The glue layers 170a-c bind the gate fill material 172 to the third gate metal layers 168a-c.

The glue layers 170a-c can include titanium nitride, tantalum nitride, or other suitable materials. The glue layers 170a-c can be deposited by an ALD process, a PVD process, a CVD process, or other suitable deposition processes. The glue layers 170a-c can have a thickness between 5 Å and 20 Å. Other materials, deposition processes, and thicknesses can be utilized for the glue layers 170a-c without departing from the scope of the present disclosure.

The gate fill material 172 can include tungsten, cobalt, copper, ruthenium, aluminum, titanium, or other suitable materials. The gate fill material 172 is a highly conductive metal that covers the other gate metal layers of the transistors 150a-c. The gate fill material 172 completely fills the remaining space in the gate trenches 144 around and above the semiconductor nanostructures 104a-c of the transistors 150a-c. The gate fill material 172 can be deposited by PVD, ALD, CVD, or other suitable deposition processes. Other materials and deposition processes can be utilized for the gate fill material 172 without departing from the scope of the present disclosure.

In FIG. 1W, formation of the transistors 150a-c is complete. The transistor 150a includes a gate electrode 174a. The gate electrode 174a includes the gate fill material 172, the glue layer 170a, first gate metal layer 160a, the second gate metal layer 164a, and the third gate metal layer 168a. The transistor 150b includes a gate electrode 174b. The gate electrode 174b includes the gate fill material 172, the glue layer 170b, the second gate metal layer 164b and the third gate metal layer 168b, but does not include the first gate metal layer 160b. The transistor 150c includes a gate electrode 174c. The gate electrode 174c includes the gate fill material 172, the glue layer 170c, and the third gate metal layer 168c, but does not include the second gate metal layer 164c or the first gate metal layer 160c.

Because the gate electrodes 174a-c include different combinations of gate metal layers, each of the transistors 150a-c have different work functions. Furthermore, the distinctness of the work functions is improved based on the utilization of the inter-sheet filler layers 156a-c. For example, because the inter-sheet filler layers 156b-c were present during deposition of the first gate metal layers 160a-c, the first gate metal layers 160b and 160c were not deposited between the semiconductor nanostructures 104b-c. Accordingly, there are no unwanted remnants of the first gate metal layers 160b and 160c between the semiconductor nanostructures 104b and 104c. The edges of the high K gate dielectric layers 154b-c are not diminished from an etching process that might otherwise be utilized to remove the first gate metal layers 160b and 160c if the inter-sheet filler layers were not utilized. The same benefits are achieved in relation to preventing deposition of the second gate metal layer 164c between the semiconductor nanostructures 104c of the transistor 150c.

Some further benefits of the process shown in relation to FIGS. 1A-1W include complete filling of the gaps between the semiconductor nanostructures 104a-c. The spaces between the semiconductor nanostructures 104a-c are entirely filled with either the first gate metal layer 160a, the second gate metal layer 164b, or the third gate metal layer 168c such that there are no pores between the semiconductor nanostructures 104a-c. Furthermore, though not shown in FIGS. 1A-1W a small intermixing layer may remain all around the high K gate dielectric layers 154a-c. The small intermixing layer can include a mixture of the material of the high K gate dielectric layers 154a-c and the inter-sheet filler layers 156a-c.

In some embodiments, after removal of the inter-sheet filler layers 156a-c, the remaining amounts of inter-sheet filler material directly below the centers of the semiconductor nanostructures 104a-c may be less than 1.8% and less than 1.2 Å.

Figure 1Y:
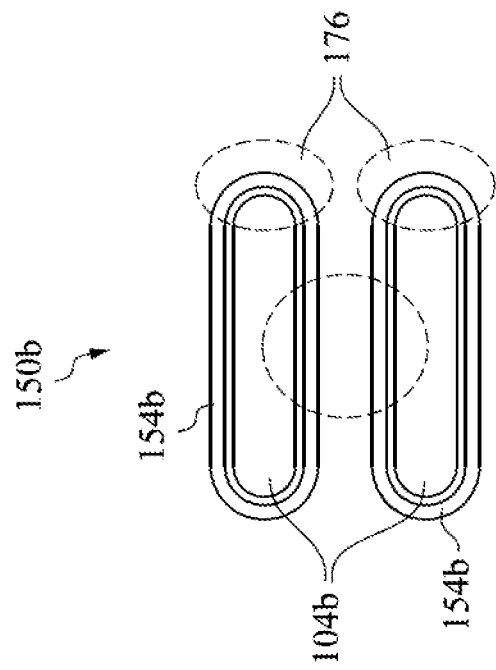
Figure 1X:
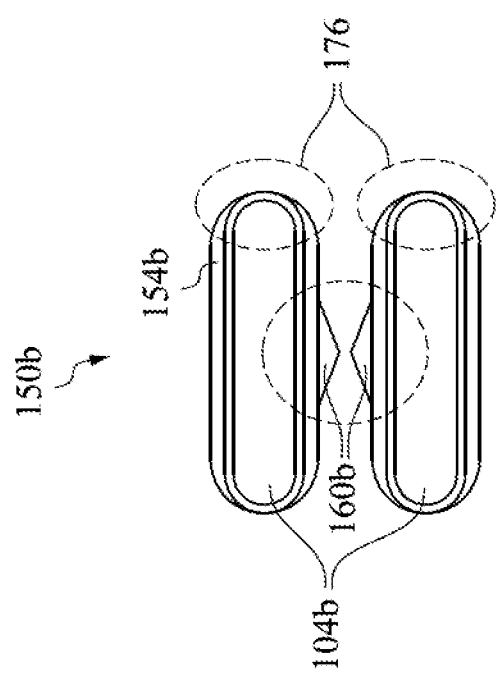

FIG. 1X is a cross-sectional view of some of the semiconductor nanostructures 104b of the transistor 150b in an alternative process that does not utilized the inter-sheet filler layer 156b. In this alternative process, the first gate metal layer 160b has been deposited between the semiconductor nanostructures 104b because the inter-sheet filler layer 156b was not present during the deposition process. An etching process has been utilized to remove the first gate metal layer 160b from between the semiconductor nanostructures 104b. However, the etching process is not able to completely remove the first gate metal layer 160b from between the semiconductor nanostructures 104b. Furthermore, this etching process has greatly reduced the thickness of the high K gate dielectric layer 154b on the sides or lateral portions 176 of the semiconductor nanostructures 104b. The result is a less distinct work function for the transistor 150b and a more poorly functioning transistor 150b due to the degradation of the high K gate dielectric 154b.

FIG. 1Y is an enlarged cross-sectional view of some of the semiconductor nanostructures 104B of the transistor 150*b* in accordance with the process described in relation to FIGS. 1O-1W. The view of FIG. 1Y corresponds to a portion of the process between the FIGS. 1S and 1T after removal of the first gate metal layer 160*b* and the inter-sheet filler layer 156*b* prior to deposition of the second gate metal layer 164*b*. As can be seen in FIG. 1Y, there are no remnants of the first gate metal layer 160*b* between the semiconductor nanostructures 104*b*. This is because the inter-sheet filler layer 156*b* was present during deposition of the first gate metal layer 160*b*. Furthermore, because a lengthy etching process is not utilized to remove the first gate metal layer 160*b* from between the semiconductor nanostructures 104*b*, the high K gate dielectric layer 154*b* is not degraded at the lateral portions 176 of the semiconductor nanostructures 104*b*. Similar results and benefits are obtained in relation to the transistor 150*c* with respect to the inter-sheet filler layer 156*c* preventing deposition of the first gate metal layer 160*c* and the second gate metal layer 164*c* between the semiconductor nanostructures 104*c*.

In some embodiments, the high K gate dielectric layer 154*b* has nearly uniform thickness around the perimeter of the semiconductor nanostructures 104*b*. The variations in thickness may be less than 2 Å. Furthermore, the high K gate dielectric layer 154*b* has very low surface roughness.

Figure 2A:
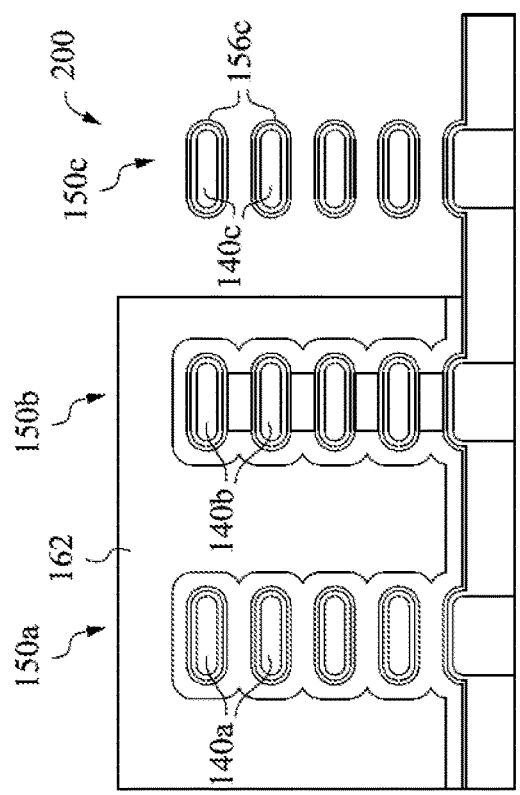
FIGS. 2A-2D are cross-sectional views of the integrated circuit, at various stages of processing, in accordance with some embodiments.
Figure 2B:
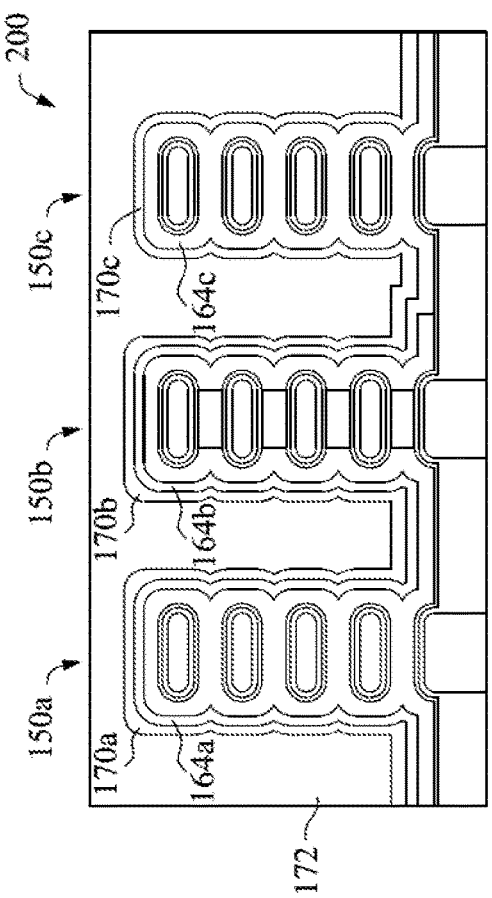

FIGS. 2A-2D are cross-sectional views of an integrated circuit 200 at various stages of processing, according to some embodiments. In FIG. 2A, the integrated circuit 200 is at a stage of processing corresponding to the integrated circuit one hundred of FIG. 1R. In FIG. 2B, a mask 162 is deposited and patterned on the integrated circuit 200. The mask 162 covers the transistor 150*a* and the transistor 150*b*. The mask 162 exposes the transistor 150*c*. An etching process has been performed to remove the first gate metal layer 160 C and the inter-sheet filler layer 156*c* from the transistor 150*c*. Accordingly, the high K gate dielectric 154*c* is exposed.

Figure 2C:
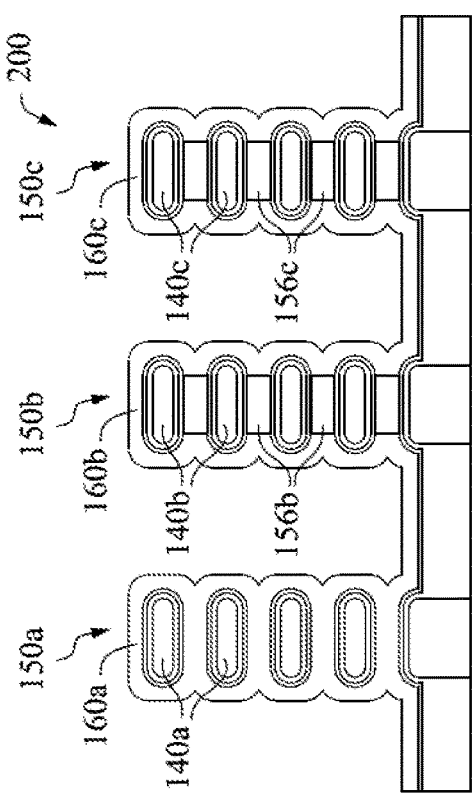

In FIG. 2C, the second gate metal layers 164*a-c* are deposited. The second gate metal layer 164*a* is deposited on the first gate metal layer 160*a*. The second gate metal layer 164*b* is deposited on the first gate metal layer 160*b*. The second gate metal layer 164*c* is deposited on the high K gate dielectric layer 154*c*. The second gate metal layer 164*c* fills the gaps between the semiconductor nanostructures 104*c* of the transistor 150*c*. The second gate metal layers 164*a-c* can include the same materials, thicknesses, and deposition processes as described previously for the second gate metal layers 164*a-c* described in relation to FIG. 1T. Alternatively, the second gate metal layers 164*a-c* can include the same materials, thicknesses, and deposition processes as described previously for the third gate metal layers 168*a-c* in relation to FIG. 1V.

Figure 2D:
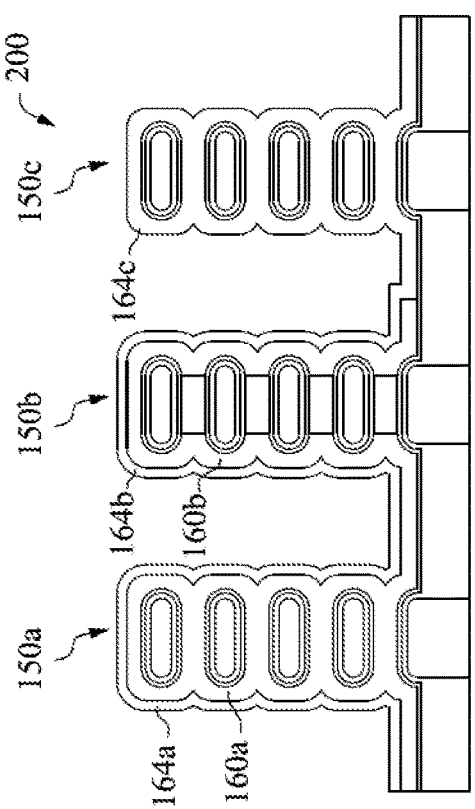

In FIG. 2D, the glue layers 170*a-c* have been deposited on the second gate metal layers 164*a-c*. The glue layers 170*a-c* can have the same materials, thicknesses, and deposition processes described for the glue layers 170*a-c* of FIG. 1W. In FIG. 2D, the gate fill material 172 has been deposited on the glue layers 170*a-c*. The gate fill material 172 can have the same materials, thicknesses, and deposition processes as described for the gate fill material 172 of FIG. 1W.

The integrated circuit 200 of FIG. 2D differs from the integrated circuit 100 of FIG. 1W in that the third gate metal layers 168*a-c* are not deposited. The integrated circuit 200 of FIG. 2D also differs from the integrated circuit 100 of FIG. 1W in that the inter-sheet filler layer 156*b* remains between the semiconductor nanostructures 104*b* of the transistor 150*b*. The transistors 150*a*-150*c* all have different work functions and different threshold voltages from each other.

FIGS. 3A-3D are cross-sectional views of an integrated circuit 300 at various stages of processing, according to some embodiments. The integrated circuit 300 of FIG. 3A corresponds to the stage of processing of the integrated circuit 100 of FIG. 1O. In particular, the inter-sheet filler layers 156*a-c* have been deposited on the between the semiconductor nanostructures 104*a-c* of the transistors 150*a-c*.

In FIG. 3B an annealing process is performed in the presence of low amounts of $O_2$. Alternatively, and oxidation treatment is performed including passing $H_2O_2$ and $O_3$ into the environment of the integrated circuit 300. The result of either of these processes is a change in the structure or strength of the portions of the inter-sheet filler layers 156*a-c* that are not directly between the semiconductor nanostructures 104*a-c*.

In FIG. 3C, a selected sidewall etch is performed. The selected sidewall etch etches the altered portions of the inter-sheet filler layers 156*a-c* selectively with respect to the portions of the inter-sheet filler layers 156*a-c* that are positioned directly between the semiconductor nanostructures 104*a-c* and that were not affected by the processes described in relation to FIG. 3B. The selected sidewall etch can include a wet etch or dry etch. In one example, the sidewall etch includes etching with $CF_4$. The result of the etching process is that the inter-sheet filler layers 156*a-c* remain only directly between the semiconductor nanostructures 104*a-c*. This process can be utilized to form the inter-sheet filler layers 156*a-c* of the integrated circuits 100 and 200 described previously.

Figure 4B:
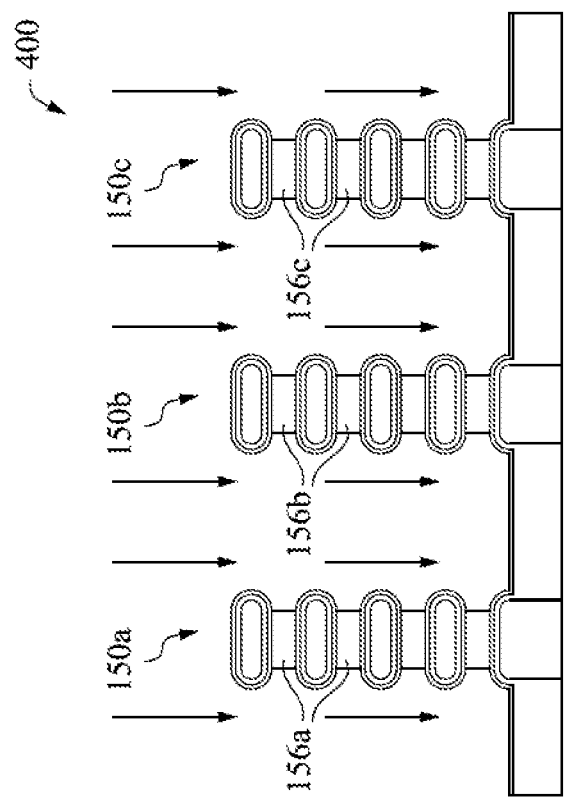
FIGS. 4A and 4B are cross-sectional views of the integrated circuit, at various stages of processing, in accordance with some embodiments.
Figure 4A:
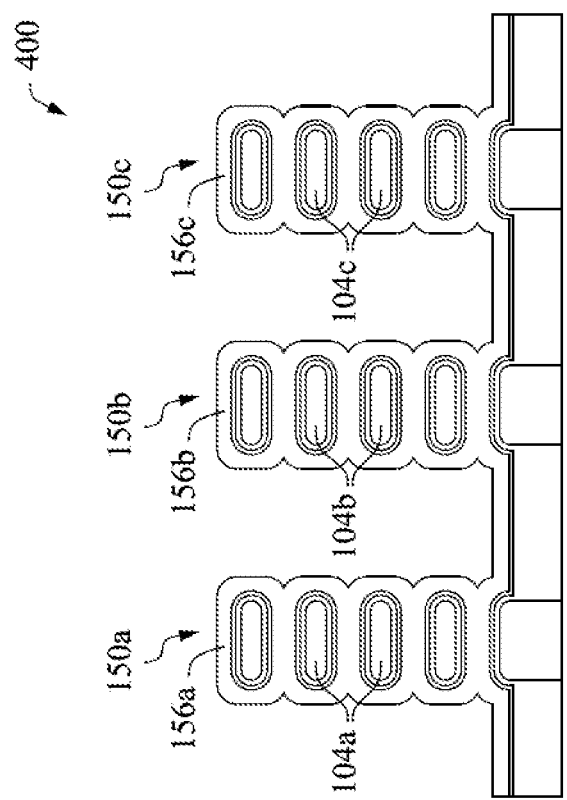

FIG. 4A is a cross-sectional view of an integrated circuit 400, according to some embodiments. In FIG. 4A, the integrated circuit 400 is at the stage of processing corresponding to the integrated circuit 100 of FIG. 1O. In particular, the inter-sheet filler layers 156*a-c* have been formed on the semiconductor nanostructures 104*a-c* the same manner as described in relation to FIG. 1O. In FIG. 4B, an anisotropic etch is performed to remove the portions of the inter-sheet filler layers 156*a-c* that are not directly between the semiconductor nanostructures 104*a-c*. The anisotropic etch can include a plasma etch that etches selectively in the downward direction. The plasma etch can include bombarding the integrated circuit 400 with plasmatized ions in the downward direction. The result of the anisotropic etch is that the inter-sheet filler layers 156*a-c* remain only directly between the semiconductor nanostructures 104*a-c*.

Figure 5:
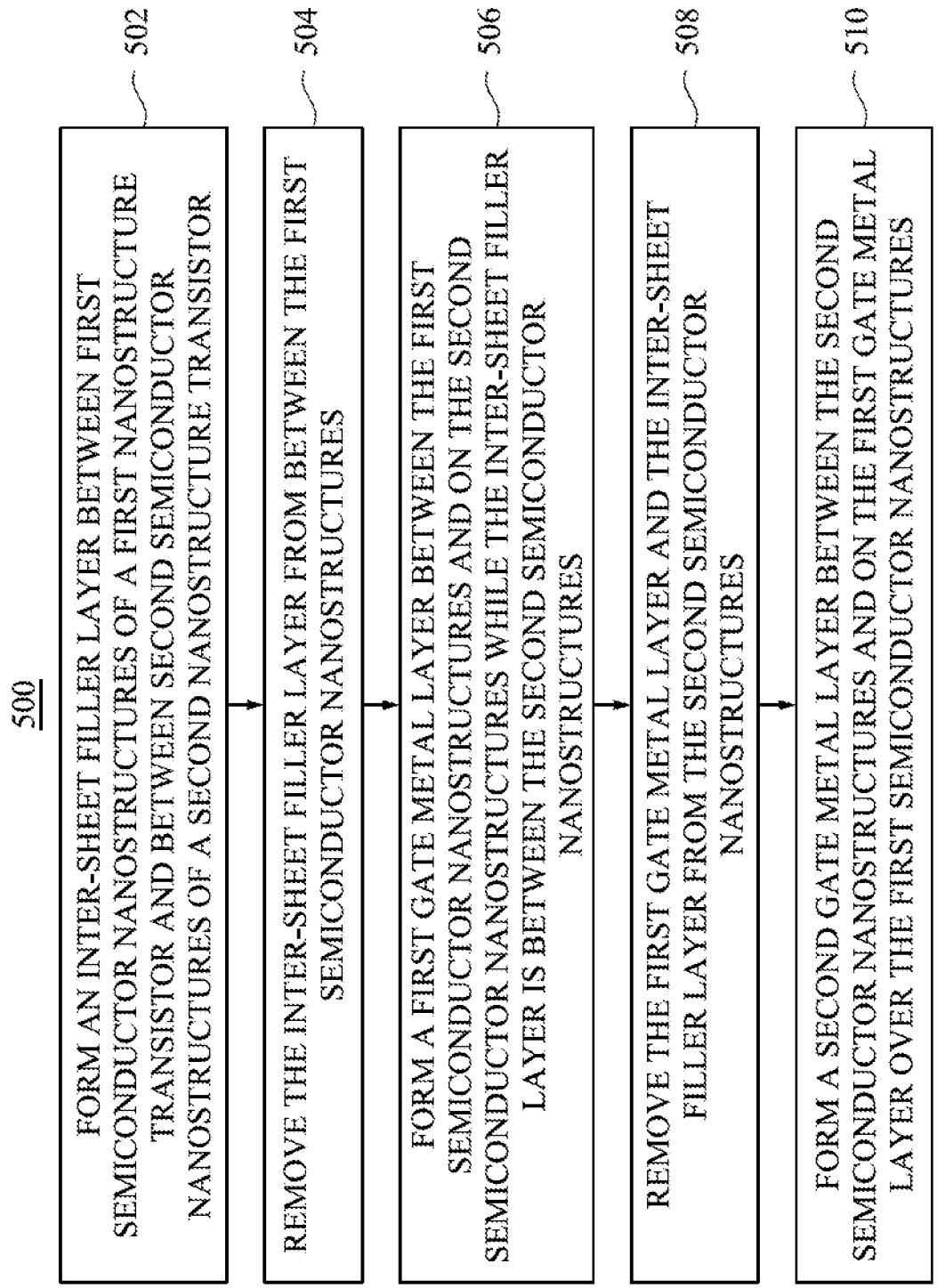
FIG. 5 is a flow diagram of a method for forming an integrated circuit, in accordance with some embodiments.

FIG. 5 is a flow diagram of a method 500 for forming an integrated circuit, according to some embodiments. The method 500 can utilize structures and processes described in relation to FIGS. 1A-4B. At 502, the method 500 includes forming an inter-sheet filler layer between first semiconductor nanostructures of a first gate all around transistor and between second semiconductor nanostructures of a second gate all around transistor. One example of a first gate all around transistor is the first gate all around transistor 150*a* of FIG. 1O. One example of a second gate all around transistor is the second gate all around transistor 150*b* of FIG. 1O. One example of first semiconductor nanostructures are the semiconductor nanostructures 104*a* of FIG. 1O. One example of second semiconductor nanostructures are the semiconductor nanostructures 104*b* of FIG. 1O. One example of an inter-sheet filler layer is the inter-sheet filler layer 156*a-b* of FIG. 1O. At 504, the method 500 includes removing the inter-sheet filler layer from between the first semiconductor nanostructures. At 506, the method 500 includes forming a first gate metal layer between the first semiconductor nanostructures and on the second semiconductor nanostructures while the inter-sheet filler layer is between the second semiconductor nanostructures. One example of a first gate metal layer is the first gate metal layer 160a-b of FIG. 1R. At 508, the method 500 includes removing the first gate metal layer and the inter-sheet filler layer from the second semiconductor nanostructures. At 510, the method 500 includes forming a second gate metal layer between the second semiconductor nanostructures and on the first gate metal layer over the first semiconductor nanostructures. One example of a second gate metal layer is the second gate metal layer 164a-b of FIG. 1T.

FIGS. 6A-6F are perspective views of an integrated circuit 100 at successive intermediate stages of processing, according to some embodiments. FIGS. 6G-6L are cross-sectional views of the integrated circuit 100 at successive intermediate stages of processing, according to some embodiments. FIGS. 6A-6L illustrate an exemplary process for producing an integrated circuit that includes nanostructure transistors. FIGS. 6A-6L illustrate how these transistors can be formed in a simple and effective process in accordance with principles of the present disclosure. FIG. 6A-6L may utilize processes, techniques, structures, and materials described in relation to FIGS. 1A-5. Other process steps and combinations of process steps can be utilized without departing from the scope of the present disclosure.

Figure 6C:
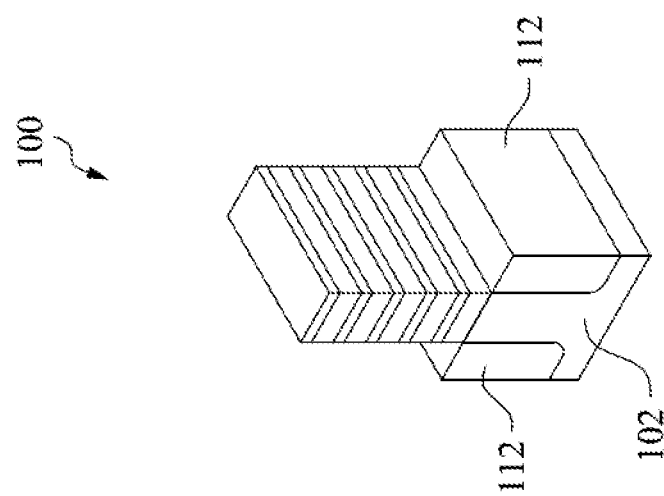
FIGS. 6A-6F are perspective views of an integrated circuit at successive intermediate stages of processing, according to some embodiments.
Figure 6B:
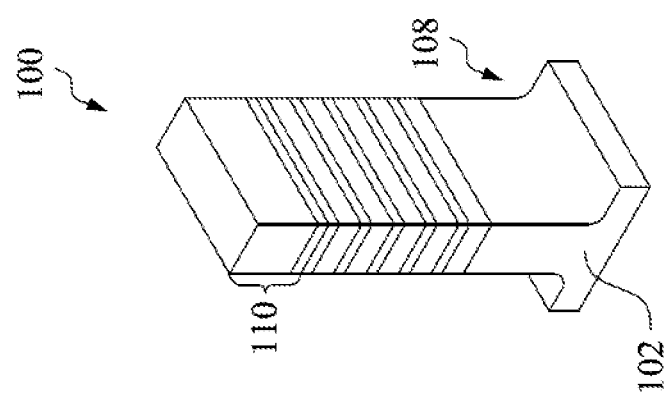
Figure 6A:
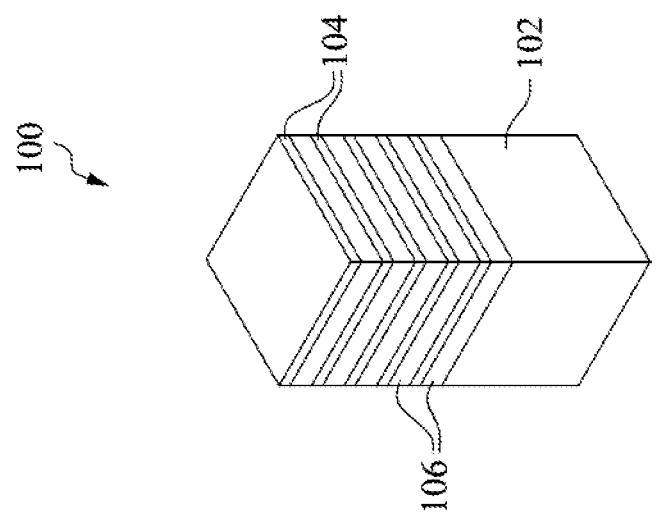

FIG. 6A illustrates a substrate 102. FIG. 6A also illustrates a stack of semiconductor nanostructures 104 and sacrificial semiconductor nanostructures 106. The substrate 102, the semiconductor nanostructures 104, and the sacrificial semiconductor nanostructures 106 can be substantially as described in relation to FIGS. 1A and 1B, though other structures, materials, and processes can be utilized without departing from the scope of the present disclosure.

In FIG. 6B a hard mask 110 has been formed on the stack of semiconductor nanostructures 104 and sacrificial semiconductor nanostructures 106. The hard mask 110 has been patterned and trenches 108 have been etched in the stack of semiconductor nanostructures 104 and sacrificial semiconductor nanostructures 106 and in the substrate 102. The hard mask 110 and the trenches 108 can be formed substantially as described in relation to FIGS. 1A and 1B, though other structures, materials, and processes can be utilized without departing from the scope of the present disclosure.

In FIG. 6C, shallow trench isolation regions 112 have been formed in the trenches 108. The shallow trench isolation regions 112 can be formed substantially as described in relation to FIGS. 1C and 1D, though other structures, materials, and processes can be utilized without departing from the scope of the present disclosure.

Figure 6F:
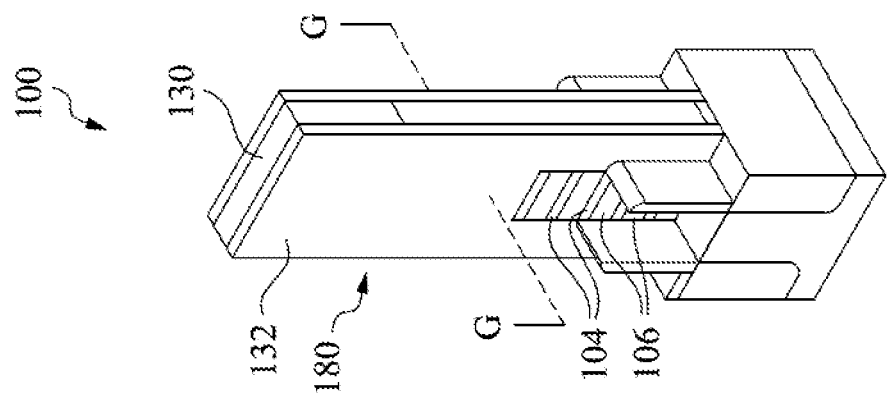
Figure 6E:
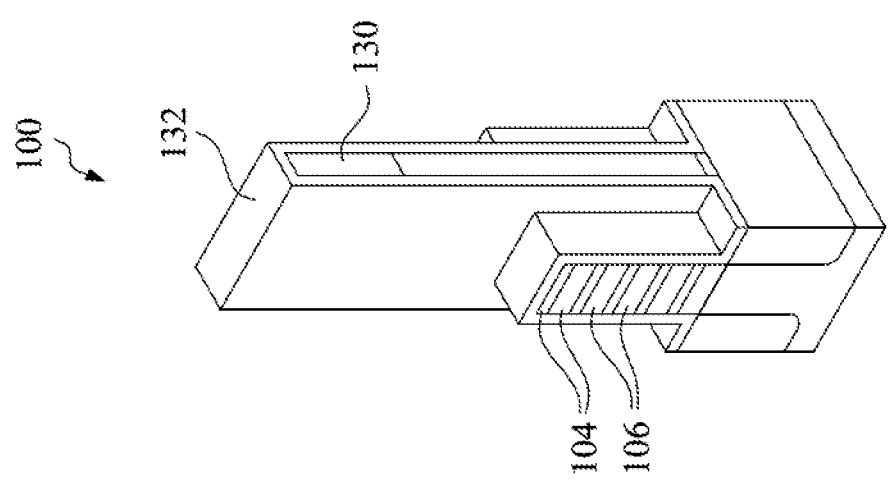
Figure 6D:
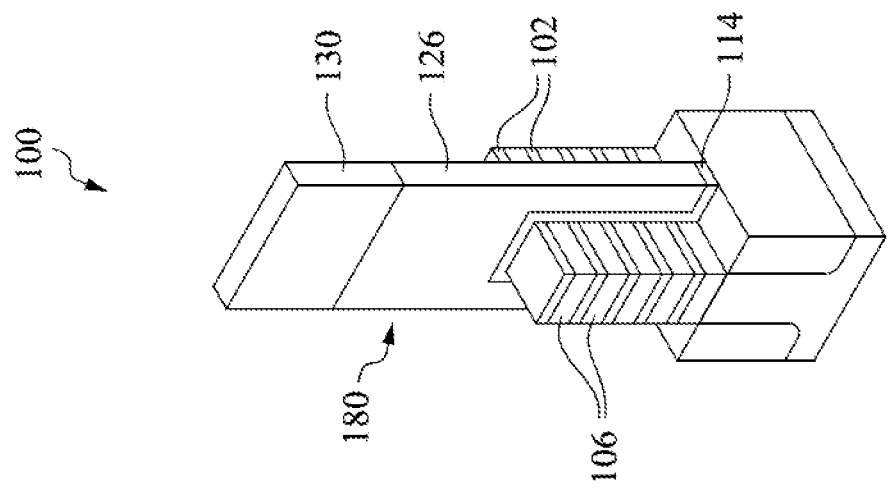

In FIG. 6D, a dummy gate structure 180 has been formed. The dummy gate structure 180 includes a cladding layer 114 formed on the stack of semiconductor nanostructures 104 and sacrificial semiconductor nanostructures 106, and on the shallow trench isolation regions 112. The dummy gate 180 includes a layer of polysilicon 126 on the cladding layer 114. The dummy gate 180 includes a dielectric layer 130 on the layer polysilicon 126. The dummy gate has been patterned to expose portions of the stack of semiconductor nanostructures 104 and sacrificial semiconductor nanostructures 106. The cladding layer 114, the layer polysilicon 126, and the dielectric layer 130 can be formed substantially as described in relation to FIGS. 1E and 1F, though other structures, materials, and processes can be utilized without departing from the scope of the present disclosure.

In FIG. 6E, a spacer layer 132 has been formed on the dummy gate 180 and on the exposed portions of the stack of semiconductor nanostructures 104 and sacrificial semiconductor nanostructures 106. The spacer layer can be formed substantially as described in relation to FIG. 1H, though the spacer layer 132 will not be positioned between the semiconductor nanosheets 104 because the sacrificial semiconductor nanosheets 106 about been etched back. Other processes, structures, and materials can be utilized for the spacer layer 132 without departing from the scope of the present disclosure.

In FIG. 6F, a substantially anisotropic etching process has been performed. The etching process etches in the downward direction. A first etching step removes the spacer layer 132 from the top of the dielectric layer 130 and from the top of the uppermost semiconductor nanostructures 104. The portions of the spacer layer 132 with larger vertical thicknesses are not removed. A second etching step removes the portions of the stack of semiconductor nanostructures 104 and sacrificial semiconductor nanostructures 106 that are not covered by the dummy gate 180. The first and second etching steps can utilize one or more of dry etches, wet etches, or other types of etches. The etching process corresponds to forming a recess for source and drain regions that will be subsequently produced. FIG. 6F also illustrates cut lines G for the cross-sectional views of FIGS. 6G-6L.

Figure 6I:
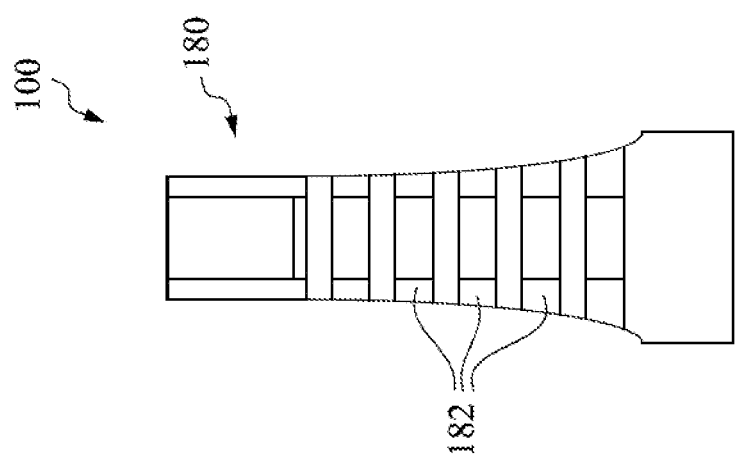
FIGS. 6G-6L are cross-sectional views of the integrated circuit at successive intermediate stages of processing, according to some embodiments
Figure 6H:
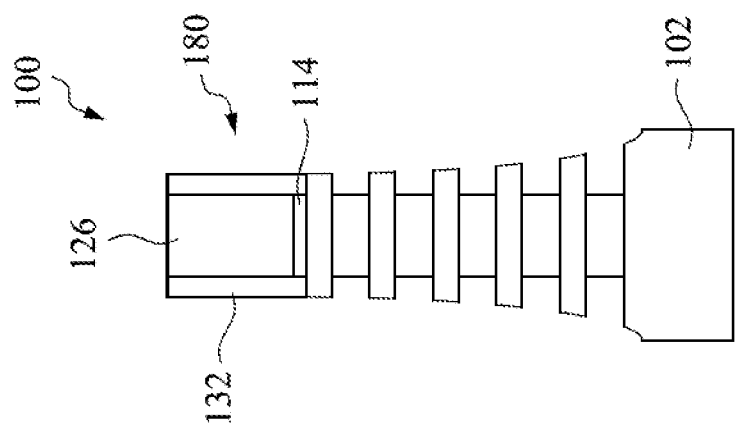
Figure 6G:
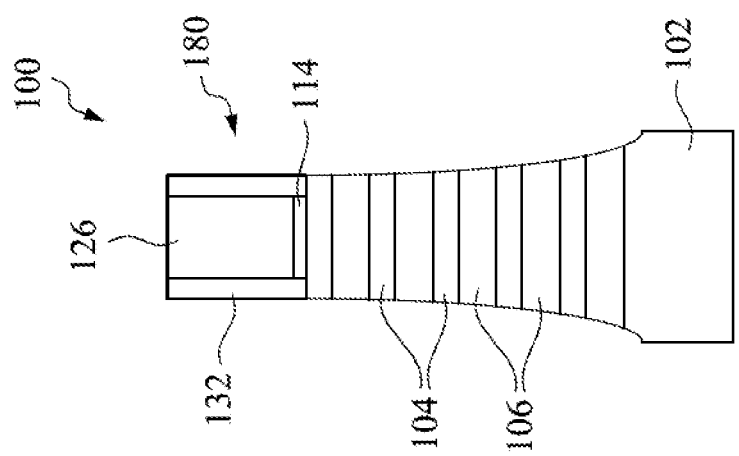

FIG. 6G is a cross-sectional view of the integrated circuit 100 at the same processing stage shown in FIG. 6E, in accordance with some embodiments. The cross-sectional view of FIG. 6G illustrates the remaining portions of the semiconductor nanostructures 104 and sacrificial semiconductor nanostructures 106 on the substrate 102. FIG. 6G also illustrates the dummy gate 180 including the cladding layer 114 the layer polysilicon 126 and the spacer layer 132. The dielectric layer 130 is not shown in FIG. 6G because the view of FIG. 6G does not extend vertically high enough to show the dielectric layer 130.

In FIG. 6H, an etching processes been performed to recess the sacrificial semiconductor nanostructures 106 relative to the semiconductor nanostructures 104. This can be accomplished by performing a selective timed etch. The etching process selectively etches the sacrificial semiconductor nanostructures 106 with respect to the semiconductor nanostructures 104. The etching process is timed to form recesses in the sacrificial semiconductor nanostructures 106 rather than to entirely remove the sacrificial semiconductor nanostructures 106. The etching process can include one or more of a dry etch, wet etch, or other type of etching process.

In FIG. 6I, an inner spacer layer 182 has been formed in the recesses adjacent to the remaining portions of the sacrificial semiconductor nanostructures 106. The inner spacer layer 182 can be formed by an ALD process, a CVD process, an epitaxial growth, or other suitable processes. The inner spacer layer 182 may include silicon nitride or another suitable dielectric material. Other processes, structures, and materials can be utilized for the inner spacer layer 182 without departing from the scope of the present disclosure.

Figure 6J:
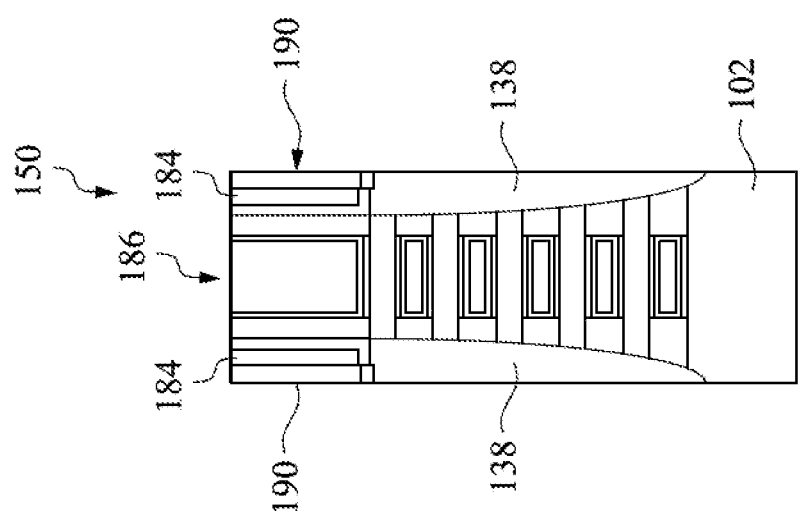

In FIG. 6J, source and drain regions 138 have been formed. The source and drain regions 138 include a semiconductor material. The source and drain regions 138 can be grown epitaxially from one or more of the semiconductor nanostructures 104, the substrate 102, and the inner spacer layer 182. The source and drain regions 138 can include silicon or other semiconductor materials. The source and drain regions 138 may be doped in situ during formation of the source and drain regions 138. Other structures, materials, and processes can be utilized for the source and drain regions 138 without departing from the scope of the present disclosure.

In FIG. 6J, a dielectric layer 183 has been formed on the source and drain regions 138 and on sidewalls of the dummy gate 180. The dielectric layer 183 can include silicon nitride or another suitable dielectric material. The dielectric layer 183 can be deposited by CVD, ALD, or other suitable deposition processes. An interlevel dielectric layer 184 has been deposited on the dielectric layer 183. The interlevel dielectric layer 184 can be deposited by ALD, CVD, or other suitable deposition processes. The interlevel dielectric layer 184 can include silicon oxide, a porous dielectric material, a low K dielectric material, an ultra-low K dielectric material, or other suitable dielectric materials. Other materials and processes can be utilized for the dielectric layer 183 in the interlevel dielectric layer 184 without departing from the scope of the present disclosure.

Figure 6K:
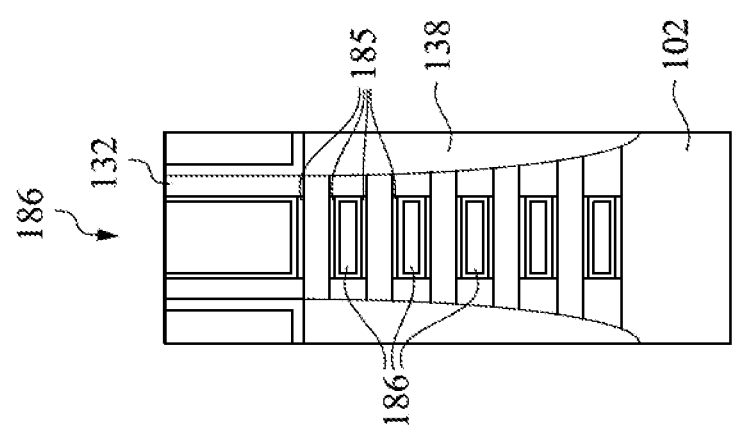

In FIG. 6K, the sacrificial semiconductor nanostructures 106 have been entirely removed. The sacrificial semiconductor nanostructures 106 may be entirely removed by an etching process that selectively etches the sacrificial semiconductor nanostructures 106 with respect to the semiconductor nanostructures 104. The etching process can include a wet etch, dry etch or other types of etches.

After removal of the sacrificial semiconductor nanostructures 106, a gate dielectric 185 is formed on the semiconductor nanostructures 104. The gate dielectric 185 surrounds the semiconductor nanostructures 104. Formation of the gate dielectric 185 utilizes the processes and structures described in relation to FIGS. 1M-1N. Accordingly, the gate dielectric 185 includes the interfacial gate dielectric layer 152 and the high K gate dielectric layer 154 described in relation to FIGS. 1M-1N, though the gate dielectric 185 is illustrated as a single layer in FIG. 6K.

After formation of the gate dielectric 185, a gate electrode 186 is formed on the gate dielectric 185. The gate electrode 186 can include one or more of the first gate metal layer 160a-c, the second gate metal layer 164a-c, the third gate metal layer 168a-c, the glue layer 170a-c, and the gate fill material 172, and the inter-sheet filler layer 156a-c as described in relation to FIGS. 1A-4B. Accordingly, the gate electrode 186 can be formed utilizing the processes, structures, and materials described in relation to FIGS. 1O-4B.

Figure 6L:
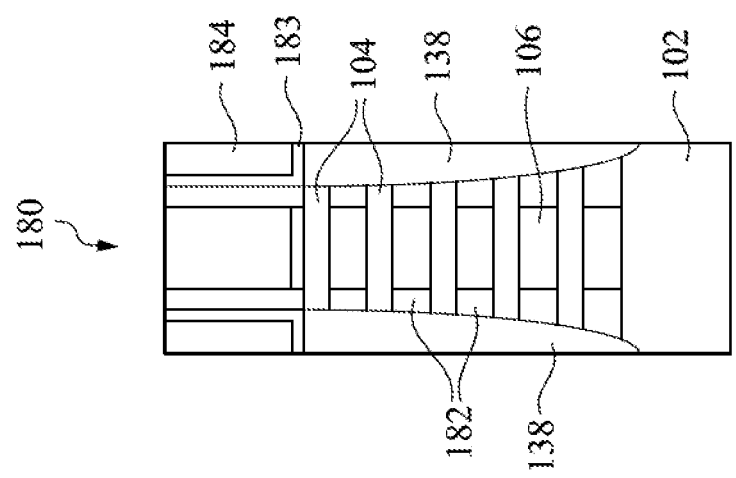

In FIG. 6L, source and drain contacts 190 have been formed in the interlevel dielectric layer 184. The source and drain contacts 190 can include a silicide in direct contact with the source and drain regions 138. The source and drain contacts 190 can include a conductive via or plug made of a conductive material such as aluminum, titanium, tungsten, copper, gold, tantalum, or other conductive materials. The source and drain contacts 190 may be formed by first etching trenches in the interlevel dielectric layer 184. Other processes and materials can be utilized to form the source and drain contacts 190 without departing from the scope of the present disclosure.

FIG. 6L corresponds to completion of a nanostructure transistor 150. The nanostructures transistor 150 may correspond to one of the transistors 150a-c described previously in relation to FIGS. 1A-4B. The nanostructure transistor 150 may have other structures, materials, components, and may utilize other processes without departing from the scope of the present disclosure.

In some embodiments, a method includes forming an inter-sheet filler layer between first semiconductor nanostructures of a first gate all around transistor and between second semiconductor nanostructures of a second gate all around transistor, removing the inter-sheet filler layer from between the first semiconductor nanostructures, and forming a first gate metal layer between the first semiconductor nanostructures and on the second semiconductor nanostructures while the inter-sheet filler layer is between the second semiconductor nanostructures. The method includes removing the first gate metal layer and the inter-sheet filler layer from the second semiconductor nanostructures and forming a second gate metal layer between the second semiconductor nanostructures and on the first gate metal layer over the first semiconductor nanostructures.

In some embodiments, an integrated circuit includes a first gate all around transistor including a plurality of first semiconductor nanostructures and a second gate all around transistor including a plurality of second semiconductor nanostructures. The integrated circuit includes an inter sheet filler layer between the second semiconductor nanostructures and a first gate metal layer between the first semiconductor nanostructures and on sides of the second semiconductor nanostructures.

In some embodiments, an integrated circuit includes a first gate all around transistor including a plurality of first semiconductor nanostructures and a second gate all around transistor including a plurality of second semiconductor nanostructures. The integrated circuit includes a gate dielectric layer surrounding the first and second semiconductor nanostructures, a first gate metal layer substantially filling a space between the first semiconductor nanostructures, and a second gate metal layer substantially filling a space between the second semiconductor nanostructures. The first gate metal layer has a thickness less than 0.2 nm between the second semiconductor nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming an inter-sheet filler layer between first semiconductor nanostructures of a first nanostructure transistor and between second semiconductor nanostructures of a second nanostructure transistor;
   removing the inter-sheet filler layer from between the first semiconductor nanostructures and the second semiconductor nanostructures;
   forming a first gate metal layer between the first semiconductor nanostructures; and
   forming a second gate metal between the second semiconductor nanostructures.

2. The method of claim 1, wherein the first nanostructure transistor has a first threshold voltage, and the second nanostructure transistor has a second threshold voltage different than the first threshold voltage.

3. The method of claim 1, further comprising:
   forming the inter-sheet filler layer between third semiconductor nanostructures of a third nanostructure transistor;

forming the first gate metal layer while the inter-sheet filler layer is between the third semiconductor nanostructures;

forming the second gate metal layer while the inter-sheet filler layer is between the third semiconductor nanostructures;

removing the first gate metal layer, the second gate metal layer, and the inter-sheet filler layer from the third semiconductor nanostructures; and forming a third gate metal layer between the third semiconductor nanostructures and on the second gate metal layer over the first and second semiconductor nanostructures.

4. The method of claim 3, wherein the first nanostructure transistor has a first threshold voltage, the second nanostructure transistor has a second threshold voltage different than the first threshold voltage, and the third nanostructure transistor has a third threshold voltage different than the first and second threshold voltages.

5. The method of claim 1, further comprising forming a gate dielectric layer on the first and second semiconductor nanostructures prior to forming the inter-sheet filler layer.

6. The method of claim 5, wherein forming the inter-sheet filler layer between the first and second semiconductor nanostructures includes forming the inter-sheet filler layer on the gate dielectric layer.

7. The method of claim 1, further comprising removing the inter-sheet filler layer from sides of the first and second semiconductor nanostructures prior to forming the first gate metal layer.

8. The method of claim 7, wherein removing the inter-sheet filler layer from sides of the first and second semiconductor nanostructures includes performing an anisotropic etch.

9. The method of claim 7, wherein removing the inter-sheet filler layer from sides of the first and second semiconductor nanostructures includes performing a sidewall conversion treatment on side portions of the inter-sheet filler layer on the sides of the first and second nanostructures and selectively etching the side portions with respect to portions of the inter-sheet filler layer between the first semiconductor nanostructures and between the second semiconductor nanostructures.

10. The method of claim 9, wherein selectively etching includes performing a wet etch.

11. A method, comprising:

forming an inter-sheet filler layer between first semiconductor nanostructures of a first nanostructure transistor and between second semiconductor nanostructures of a second nanostructure transistor;

removing the inter-sheet filler layer from between the first semiconductor nanostructures;

forming a first gate metal layer between the first semiconductor nanostructures and in contact with inter-sheet filler layer between the second semiconductor nanostructures; and forming a second gate metal layer on the first gate metal layer on the first and second semiconductor nanostructures.

12. The method of claim 11, wherein the second gate metal layer is between third semiconductor nanostructures of a third nanostructure transistor.

13. The method of claim 12, wherein the second gate metal layer is formed after the first gate metal layer has been removed from the third semiconductor nanostructures.

14. The method of claim 11, wherein the inter-sheet filler layer includes silicon.

15. An integrated circuit, comprising:

a first nanostructure transistor including a plurality of first semiconductor nanostructures;

a second nanostructure transistor including a plurality of second semiconductor nanostructures;

a third nanostructure transistor including a plurality of third semiconductor nanostructures;

an inter sheet filler layer between the second semiconductor nanostructures;

a first gate metal layer substantially filling a space between the first semiconductor nanostructures and in contact with the inter-sheet filler layer; and a second gate metal layer substantially filling a space between the third semiconductor nanostructures.

16. The integrated circuit of claim 15, wherein the second gate metal layer is on the first gate metal layer on sides of the first semiconductor nanostructures.

17. The integrated circuit of claim 15, wherein the gate dielectric has a variation in thickness less than 0.2 nm on the second semiconductor nanostructures.

18. The integrated circuit of claim 15, wherein the first and second gate metal layers are different materials.

19. The integrated circuit of claim 15, further comprising a glue layer on the second gate metal layer.

20. The integrated circuit of claim 19, further comprising a gate fill material on the glue layer.

* * * * *